United States Patent
Lee et al.

(10) Patent No.: US 11,942,458 B2
(45) Date of Patent: Mar. 26, 2024

(54) SEMICONDUCTOR PACKAGE INCLUDING A THROUGH-ELECTRODE PENETRATING A MOLDING PART

(71) Applicant: Samsung Electronics Co., Ltd., Suwon-si (KR)

(72) Inventors: Doohwan Lee, Anyang-si (KR); Wonkyoung Choi, Anyang-si (KR); Jeongho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 94 days.

(21) Appl. No.: 17/511,178

(22) Filed: Oct. 26, 2021

(65) Prior Publication Data
US 2022/0262777 A1    Aug. 18, 2022

(30) Foreign Application Priority Data
Feb. 16, 2021  (KR) .................. 10-2021-0020633

(51) Int. Cl.
*H01L 25/065*    (2023.01)
*H01L 21/56*    (2006.01)
(Continued)

(52) U.S. Cl.
CPC ............ *H01L 25/105* (2013.01); *H01L 21/56* (2013.01); *H01L 23/49816* (2013.01); *H01L 24/16* (2013.01); *H01L 24/20* (2013.01); *H01L 24/73* (2013.01); *H01L 25/0652* (2013.01); *H01L 24/48* (2013.01); *H01L 2224/023* (2013.01); *H01L 2224/16146* (2013.01); *H01L 2224/16235* (2013.01); *H01L 2224/2101* (2013.01);
(Continued)

(58) Field of Classification Search
CPC ................. H01L 25/0652; H01L 23/28; H01L 23/31–3128; H01L 21/56–565; H01L 2924/181; H01L 23/5385; H01L 23/5389; H01L 2224/023; H01L 2224/0233; H01L 2224/02331; H01L 2224/02335; H01L 2224/0237; H01L 2224/02372–02379; H01L 2225/06572; H01L 2225/06541; H01L 2225/06548; H01L 23/49811
See application file for complete search history.

(56) References Cited

U.S. PATENT DOCUMENTS 8,754,514 B2    6/2014  Yu et al.
9,490,167 B2   11/2016  Chen et al.
(Continued)

*Primary Examiner* — Phat X Cao
*Assistant Examiner* — William Henry Anderson
(74) *Attorney, Agent, or Firm* — Muir Patent Law, PLLC

(57) ABSTRACT

A semiconductor package includes a first substrate, a first semiconductor chip and a passive device which are laterally spaced apart from each other on the first substrate and are disposed face-up on the first substrate, a first molding part surrounding the first semiconductor chip and the passive device on the first substrate, a second semiconductor chip disposed on the first molding part and electrically connected to the first semiconductor chip and the passive device, a second molding part surrounding the second semiconductor chip on the first molding part, first through-electrodes vertically penetrating the first molding part, at least some of first through-electrodes electrically connect the first substrate to the second semiconductor chip, and external terminals provided under the first substrate.

20 Claims, 18 Drawing Sheets

(51) Int. Cl.
    *H01L 23/00*     (2006.01)
    *H01L 23/498*    (2006.01)
    *H01L 25/10*     (2006.01)

(52) U.S. Cl.
    CPC .............. *H01L 2224/211* (2013.01); *H01L 2224/48225* (2013.01); *H01L 2224/73209* (2013.01); *H01L 2225/06541* (2013.01); *H01L 2225/06548* (2013.01); *H01L 2225/06572* (2013.01); *H01L 2924/181* (2013.01)

(56) References Cited

U.S. PATENT DOCUMENTS

| | | |
|---|---|---|
| 9,837,378 B2 | 12/2017 | Khan et al. |
| 9,935,087 B2 | 4/2018 | Zhai et al. |
| 10,181,455 B2 * | 1/2019 | Zhai .................. H01L 23/3135 |
| 10,453,785 B2 | 10/2019 | Shim et al. |
| 10,665,575 B2 | 5/2020 | Song et al. |
| 10,720,409 B2 * | 7/2020 | Yu ...................... H01L 23/3738 |
| 10,784,248 B2 | 9/2020 | Yu et al. |
| 2017/0117263 A1 | 4/2017 | Yeh et al. |
| 2020/0266178 A1 | 8/2020 | Lee et al. |
| 2020/0343220 A1 | 10/2020 | Chen et al. |
| 2020/0411445 A1 * | 12/2020 | Chen .................. H01L 21/4857 |
| 2021/0020574 A1 * | 1/2021 | Yu ...................... H01L 25/0652 |
| 2021/0104551 A1 * | 4/2021 | Lin .................... G11C 13/0007 |
| 2021/0375765 A1 * | 12/2021 | Tseng .................. H01L 24/19 |
| 2022/0199461 A1 * | 6/2022 | Yu ...................... H01L 21/56 |
| 2022/0223534 A1 * | 7/2022 | Lin .................... H01L 23/3135 |

\* cited by examiner

SEMICONDUCTOR PACKAGE INCLUDING A THROUGH-ELECTRODE PENETRATING A MOLDING PART

CROSS-REFERENCE TO RELATED APPLICATION

This U.S. non-provisional patent application claims priority under 35 U.S.C. § 119 to Korean Patent Application No. 10-2021-0020633, filed on Feb. 16, 2021 in the Korean Intellectual Property Office, the disclosure of which is hereby incorporated by reference in its entirety.

BACKGROUND

The present inventive concepts relates to a semiconductor package and a method of manufacturing the same.

An integrated circuit chip may be realized in the form of a semiconductor package to be appropriately applied to an electronic product. In a typical semiconductor package, a semiconductor chip may be mounted on a printed circuit board (PCB) and may be electrically connected to the PCB through bonding wires or bumps.

High-performance, high-speed and small semiconductor devices and electronic products using the same have been increasingly demanded in the semiconductor industry and in the electronic industry. In response to these trends, a technique of stacking semiconductor chips on a single package substrate and a technique of stacking a package on another package have been suggested as semiconductor mounting techniques. For example, in a package-on-package (PoP) technique, various semiconductor chips may be vertically stacked to realize a high-density chip stack. The package-on-package (PoP) technique may integrate semiconductor chips having various functions in a smaller area than a general package having a single semiconductor chip.

SUMMARY

Some example embodiments of the present inventive concepts may provide a small semiconductor package and a method of manufacturing the same.

Some example embodiments of the present inventive concepts may also provide a semiconductor package with improved electrical characteristics and a method of manufacturing the same.

According to some example embodiments of the present inventive concepts, a semiconductor package may include a first substrate, a first semiconductor chip and a passive device which are laterally spaced apart from each other on the first substrate and are disposed face-up on the first substrate, a first molding part surrounding the first semiconductor chip and the passive device on the first substrate, a second semiconductor chip disposed on the first molding part and electrically connected to the first semiconductor chip and the passive device, a second molding part surrounding the second semiconductor chip on the first molding part, first through-electrodes vertically penetrating the first molding part, at least some of first through-electrodes electrically connect the first substrate to the second semiconductor chip, and external terminals provided under the first substrate. The first semiconductor chip may include a base layer, a circuit layer provided on a top surface of the base layer, the top surface of the base layer faces the second semiconductor chip, and a via penetrating the base layer to be electrically connected to the circuit layer.

According to some example embodiments of the present inventive concepts, a semiconductor package may include a first substrate, a first device and a second device spaced apart from each other on the first substrate, a third device disposed on the first device and the second device, wherein a first active surface of the first device and a second active surface of the second device face a third active surface of the third device, a first molding part surrounding the first device and the second device on the first substrate, a second molding part surrounding the third device on the first molding part, first through-electrodes vertically penetrating the first molding part between the first device and the second device to electrically connect the first substrate to the third device, second through-electrodes vertically penetrating the first molding part, and third through-electrodes vertically penetrating the second molding part to be electrically connected to the second through-electrodes. The third device may vertically overlap with the whole of the first device and the whole of the second device.

According to some example embodiments of the present inventive concepts, a semiconductor package may include a lower package, and an upper package mounted on the lower package. The lower package may include a first substrate, a first semiconductor chip on the first substrate, the first semiconductor chip having first chip pads facing the first substrate, a second semiconductor chip and a passive device which are provided on the first substrate, are provided on a bottom surface of the first semiconductor chip and are electrically connected to the first chip pads, a first molding part surrounding the second semiconductor chip and the passive device on the first substrate, a first through-electrode vertically penetrating the first molding part to electrically connect the first semiconductor chip to the first substrate, a second through-electrode vertically penetrating the first molding part at a side of the second semiconductor chip to be electrically connected to the first substrate, and a second molding part surrounding the first semiconductor chip on the first molding part. The upper package may include an upper package substrate, an upper semiconductor chip mounted on the upper package substrate, an upper molding part covering the upper semiconductor chip on the upper package substrate, and a package connection terminal provided under the upper package substrate and electrically connecting the upper package to the lower package.

DETAILED DESCRIPTION OF THE EMBODIMENTS

Semiconductor packages according to the present inventive concepts will be described hereinafter with reference to the accompanying drawings.

Figure 1:
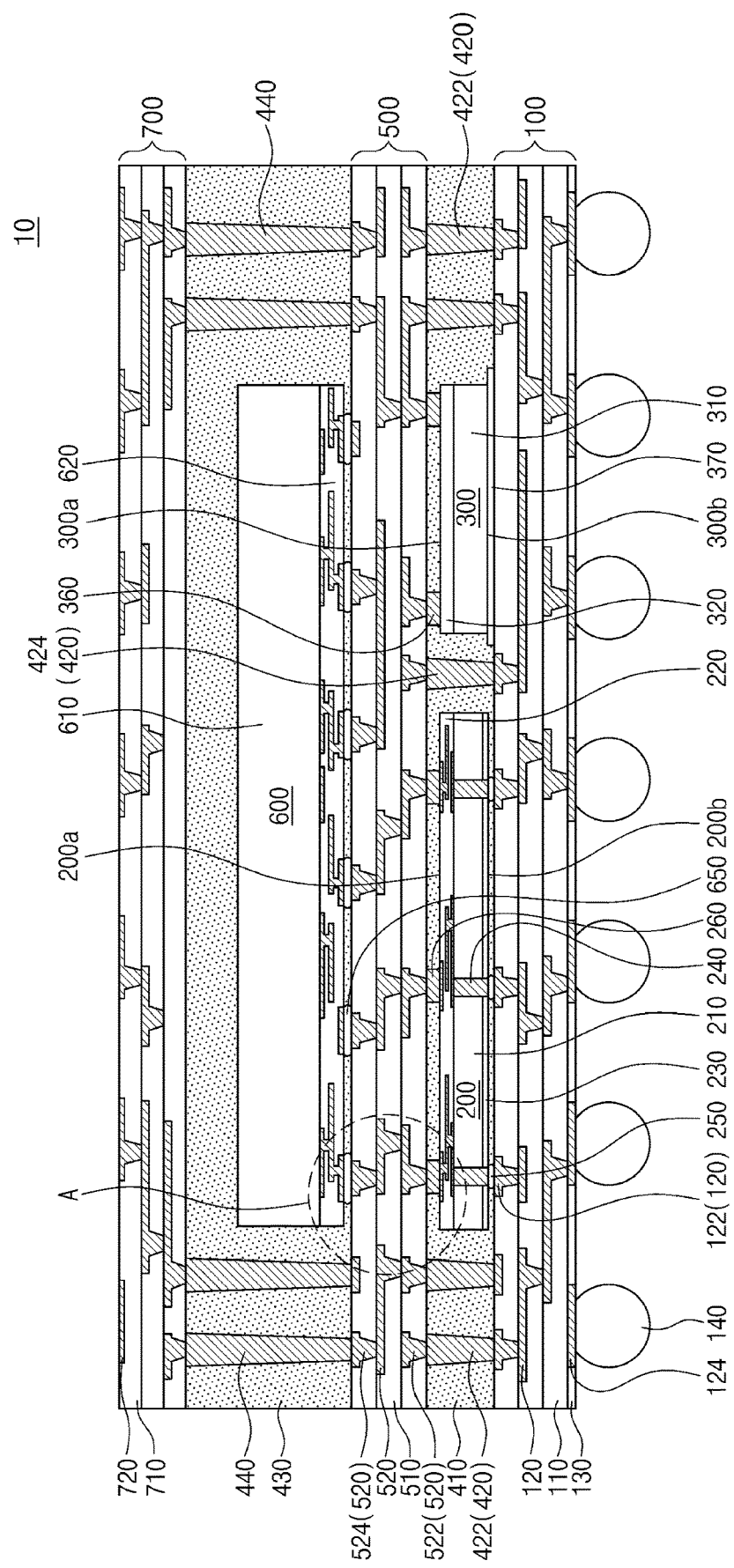
FIG. 1 illustrates a cross-sectional view showing a semiconductor package according to some example embodiments of the present inventive concepts.
Figure 2:
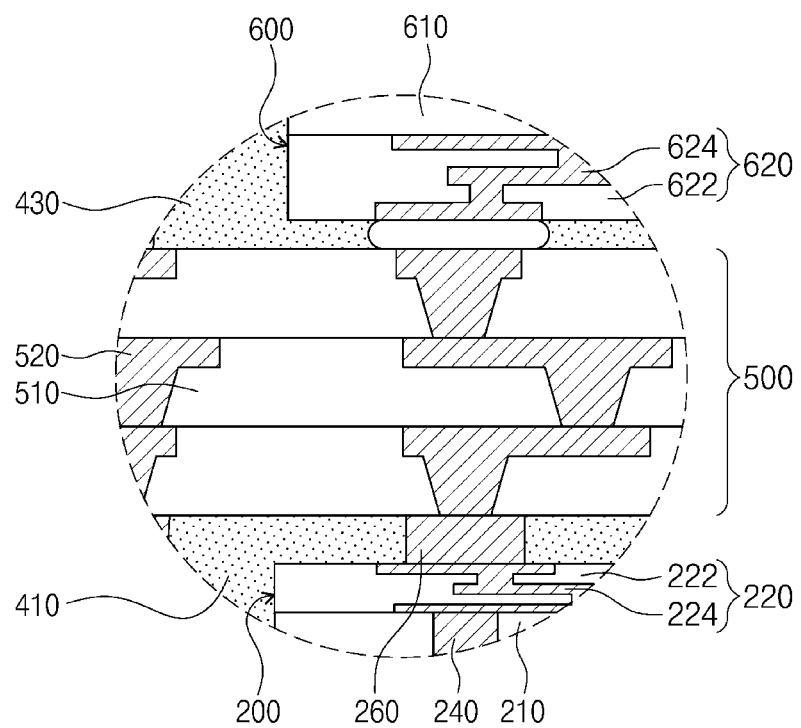
FIG. 2 illustrates an enlarged view of a region 'A' of FIG. 1.
Figure 3:
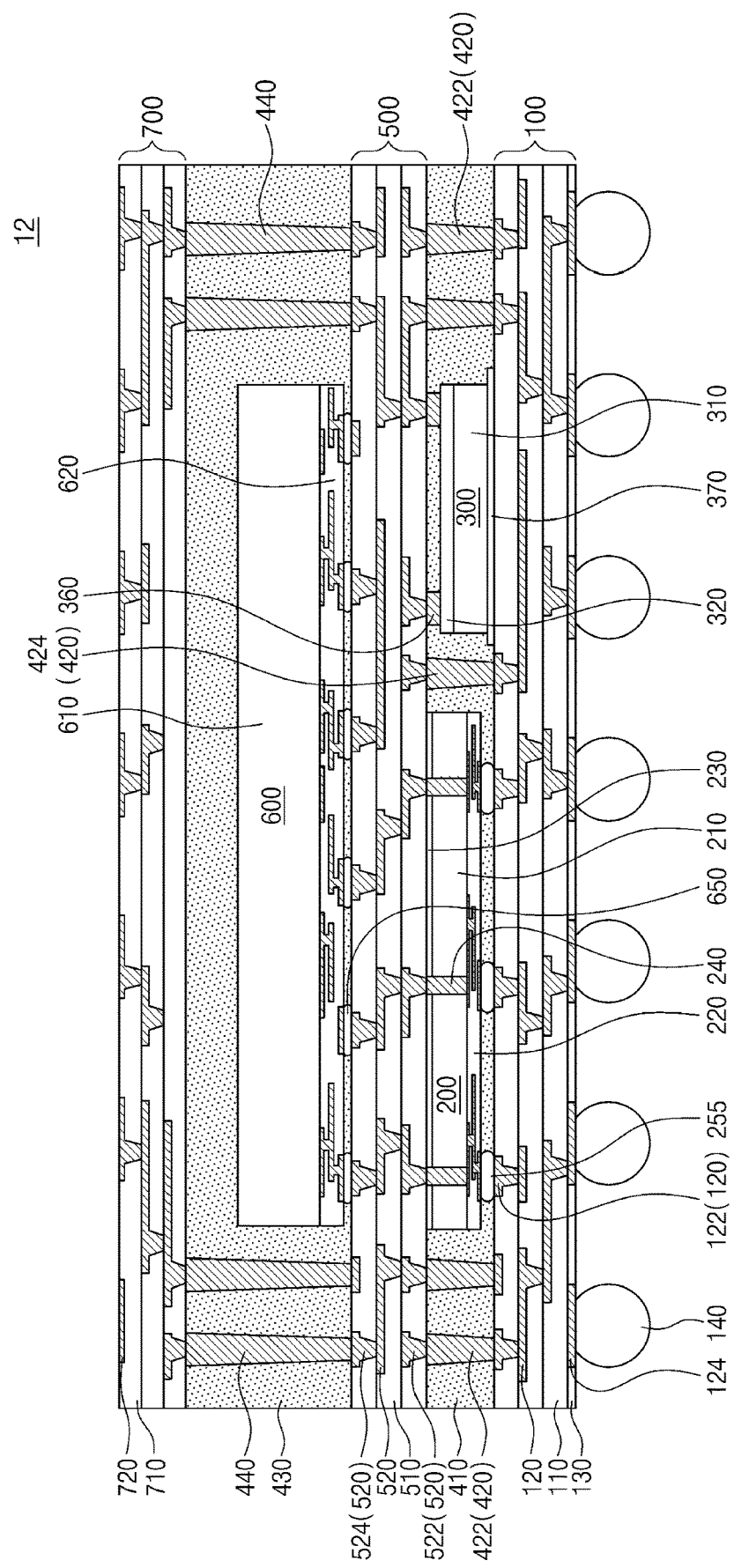
FIG. 3 illustrates a cross-sectional view showing a semiconductor package according to some example embodiments of the present inventive concepts.

FIG. 1 illustrates a cross-sectional view showing a semiconductor package according to some example embodiments of the present inventive concepts. FIG. 2 illustrates an enlarged view of a region 'A' of FIG. 1. FIG. 3 illustrates a cross-sectional view showing a semiconductor package according to some example embodiments of the FIG. inventive concepts.

Referring to FIGS. 1 and 2, a first package substrate 100 may be provided. The first package substrate 100 may include one or more substrate interconnection layers sequentially stacked. Each of the substrate interconnection layers may include a first substrate insulating layer 110 and a first substrate interconnection pattern 120 in the first substrate insulating layer 110. The first substrate interconnection pattern 120 of one substrate interconnection layer may be electrically connected to the first substrate interconnection pattern 120 of another substrate interconnection layer adjacent thereto.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

The first substrate insulating layer 110 may include or be formed of an insulating polymer or a photoimageable dielectric (PID). For example, the photoimageable dielectric (PID) may include or be formed of at least one of photosensitive polyimide, polybenzoxazole (PBO), a phenol-based polymer, or a benzocyclobutene-based polymer.

The first substrate interconnection pattern 120 may be provided in the first substrate insulating layer 110. The first substrate interconnection pattern 120 may have a damascene structure. For example, the first substrate interconnection pattern 120 may include a head portion and a tail portion which are connected to each other in one body. For example, the head portion and the tail portion of the first substrate interconnection pattern 120 may be integrally formed by the same process. The head portion may be an interconnection portion or pad portion horizontally extending in the first package substrate 100. A horizontal direction in this disclosure may be a direction parallel a top surface of the first package substrate 100. The tail portion may be a via portion vertically extending and connecting interconnection lines (e.g., the interconnection portion(s) and/or the pad portion(s)) in the first package substrate 100. The first substrate interconnection pattern 120 may have a T-shaped cross section. A top surface of the first substrate interconnection pattern 120 (i.e., a top surface of the head portion of the first substrate interconnection pattern 120) may be exposed at a top surface of the first substrate insulating layer 110. The head portion of the first substrate interconnection pattern 120 of an uppermost one of the substrate interconnection layers may correspond to a first substrate pad 122 for mounting a semiconductor chip on the first package substrate 100. A bottom surface of the first substrate interconnection pattern 120 (i.e., a bottom surface of the tail portion of the first substrate interconnection pattern 120) may be exposed at a bottom surface of the first substrate insulating layer 110. The tail portion may be electrically/directly connected to the head portion of the first substrate interconnection pattern 120 of the substrate interconnection layer disposed thereunder. The first substrate interconnection pattern 120 may include or be formed of a conductive material. For example, the first substrate interconnection pattern 120 may include or be formed of copper (Cu).

Even though not shown in the drawings, a barrier layer may be disposed between the first substrate insulating layer 110 and the first substrate interconnection pattern 120. The barrier layer may conformally cover a side surface and a bottom surface of the first substrate interconnection pattern 120. A gap between the first substrate interconnection pattern 120 and the first substrate insulating layer 110 (i.e., a thickness of the barrier layer) may range from 50 Å to 1000 Å. The barrier layer may include or be formed of a metal such as titanium (Ti) or tantalum (Ta) and/or may include or be formed of a metal nitride such as titanium nitride (TiN) or tantalum nitride (TaN).

A second substrate pad 124 may be provided under a lowermost one of the substrate interconnection layers. The second substrate pad 124 may be electrically/directly connected to the first substrate interconnection pattern 120. The second substrate pad 124 may include or be formed of a conductive material. For example, the second substrate pad 124 may include or be formed of copper (Cu).

A substrate passivation layer 130 may be provided under the lowermost substrate interconnection layer. The substrate passivation layer 130 may cover the whole of a bottom surface of the first package substrate 100, e.g., on which second substrate pads 124 are not formed. For example, the second substrate pads 124 may be exposed at a bottom surface of the substrate passivation layer 130.

External terminals 140 may be provided on the exposed second substrate pads 124, respectively. The external terminals 140 may include or may be solder balls or solder bumps.

A first device 200 and a second device 300 may be disposed on the first package substrate 100.

The first device 200 may be disposed on a top surface of the first package substrate 100. The first device 200 may be a semiconductor chip. For example, the first device 200 may be a memory chip. Alternatively, the first device 200 may be a logic chip. The first device 200 may be disposed face-up on the first package substrate 100. For example, the first device 200 may have a back surface 200b facing the first package substrate 100 and a front surface 200a opposite to the back surface 200b. In the present specification, the front surface may be a surface correspond to an active surface of an integrated device in a semiconductor chip and may be defined as a surface on which pads of the semiconductor chip are formed. The back surface may be defined as another surface opposite to the front surface. For example, the front surface 200a of the first device 200 may be an active surface of the semiconductor chip and the back surface 200b of the semiconductor chip may be an opposite surface to the active surface. The first device 200 may include a first base layer 210, a first circuit layer 220 and a first passivation layer 230 provided on both surfaces of the first base layer 210, respectively, and at least one first via 240 penetrating the first base layer 210.

The first base layer 210 may include or be formed of silicon (Si). An integrated device or integrated circuits may be formed in an upper portion of the first base layer 210.

The first circuit layer 220 may be provided on a top surface of the first base layer 210. The first circuit layer 220 may be electrically connected to the integrated device or integrated circuits formed in the first base layer 210. For example, the first circuit layer 220 may include a first circuit pattern 224 provided in a first insulating pattern 222, and the first circuit pattern 224 may be electrically/directly connected to the integrated device or integrated circuits formed in the first base layer 210. A portion of the first circuit pattern 224 may be exposed at a top surface of the first circuit layer 220, and the exposed portion of the first circuit pattern 224 may correspond to a first chip pad 224 of the first device 200 (hereinafter, the first chip pad and the first circuit pattern will be indicated by the same reference numeral '224' for the purpose of ease and convenience in explanation, e.g., the first chip pad may be a portion of the first circuit pattern 224). A top surface 200a (i.e., the front surface) of the first device 200, at which the first circuit layer 220 is provided, may be an active surface of the first device 200.

The first passivation layer 230 may be provided on a bottom surface of the first base layer 210. The first passivation layer 230 may include or be formed of an insulating material. For example, the first passivation layer 230 may include or be formed of silicon nitride (SiN), silicon oxide (SiO), or silicon oxynitride (SiON).

The first via 240 may vertically penetrate the first base layer 210 and the first passivation layer 230. One end of the first via 240 may be exposed at a bottom surface of the first passivation layer 230. A bottom surface of the first via 240 may be coplanar with the bottom surface of the first passivation layer 230 (e.g., the back surface 200b of the first device 200). The bottom surface of the first via 240 and the bottom surface of the first passivation layer 230 may be substantially flat. The first via 240 may extend toward the front surface 200a of the first device 200 from the one end of the first via 240. Another end of the first via 240 may be electrically/directly connected to the first circuit layer 220. The first via 240 may be electrically/directly connected to the first circuit pattern 224 of the first circuit layer 220.

Terms such as "same," "equal," "planar," "flat," or "coplanar," as used herein encompass identically or near identically including variations that may occur, for example, due to manufacturing processes. The term "substantially" may be used herein to emphasize this meaning, unless the context or other statements indicate otherwise.

The first device 200 may be mounted on the first package substrate 100. For example, the first passivation layer 230 of the first device 200 may face the first package substrate 100. Here, a first chip terminal (or a first connection terminal) 250 may be provided under the first via 240 of the first device 200. The first device 200 may be mounted on the first package substrate 100 through the first chip terminal 250. The first chip terminal 250 may electrically connect the first via 240 of the first device 200 to the first substrate pad 122 of the first package substrate 100. For example, the first chip terminal 250 may contact the first via 240 and the first substrate pad 122.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In certain embodiments, an additional chip pad may further be provided on the bottom surface of the first device 200 as necessary. The additional chip pad may be provided on the bottom surface of the first passivation layer 230 to be electrically/directly connected to the first via 240. In this case, the first chip terminal 250 may be provided on the additional chip pad and may electrically/directly connect the additional chip pad to the first substrate pad 122.

A first chip bump 260 may be provided on the front surface 200a of the first device 200. The first chip bump 260 may be electrically connected to the first circuit layer 220. For example, the first chip bump 260 may be electrically connected to and/or contact the exposed first chip pad 224 of the first circuit pattern 224. A thickness of the first chip bump 260 may range from 0.1 mm to 10 mm. A width of the first chip bump 260 in a horizontal direction may be substantially uniform from its bottom to its top. The first chip bump 260 may include or be formed of copper (Cu).

Even though not shown in the drawings, the first chip bump 260 may further include a seed layer. The seed layer may cover a bottom surface of the first chip bump 260. The seed layer may be disposed between the first chip bump 260 and the first circuit pattern 224 of the first device 200. Alternatively, the seed layer may cover the bottom surface and side surfaces of the first chip bump 260. The seed layer may extend from between the first chip bump 260 and the first circuit pattern 224 of the first device 200 onto the side surfaces of the first chip bump 260.

The second device 300 may be disposed on the top surface of the first package substrate 100. The second device 300 may be laterally spaced apart from the first device 200. The second device 300 may include or may be a passive device. For example, the second device 300 may include or may be a capacitor, a resistor, or a combination thereof. The second device 300 may be disposed face-up on the first package substrate 100. For example, the second device 300 may have a back surface 300b facing the first package substrate 100 and a front surface 300a opposite to the back surface 300b. The second device 300 may include a second base layer 310 and a second circuit layer 320 provided on a top surface of the second base layer 310.

The second base layer 310 may include silicon (Si). The passive device may be formed in an upper portion of the second base layer 310.

The second circuit layer 320 may be provided on the top surface of the second base layer 310. The second circuit layer 320 may be electrically connected to the passive device formed in the second base layer 310. For example, the second circuit layer 320 may include a second circuit pattern provided in a second insulating pattern, and the second circuit pattern may be electrically connected to and/or contact the passive device formed in the second base layer 310. A portion of the second circuit pattern may be exposed at a top surface of the second circuit layer 320, and the exposed portion of the second circuit pattern may correspond to a second chip pad of the second device 300. A top surface 300a (i.e., the front surface) of the second device 300, at which the second circuit layer 320 is provided, may be an active surface of the second device 300.

A second chip bump 360 may be provided on the front surface 300a of the second device 300. The second chip bump 360 may be electrically connected to the second circuit layer 320. For example, the second chip bump 360 may be electrically connected to and/or contact the exposed second chip pad of the second circuit pattern. A thickness of the second chip bump 360 may range from 0.1 mm to 10 mm. The second chip bump 360 may include or be formed of copper (Cu).

The second device 300 may be adhered to the first package substrate 100. For example, the second device 300 may be adhered to the top surface of the first package substrate 100 by using an adhesive film 370. The adhesive film 370 may be provided on a bottom surface of the second base layer 310 of the second device 300. For example, the adhesive film 370 may be formed of an inorganic adhesive or a polymer adhesive. For example, the polymer adhesive may include or may be a thermosetting polymer or a thermoplastic polymer.

A first molding part 410 may be provided on the first package substrate 100. The first molding part 410 may cover the top surface of the first package substrate 100. The first molding part 410 may surround the first device 200 and the second device 300, e.g., in a plan view. The first molding part 410 may cover/contact side surfaces of the first device 200 and side surfaces of the second device 300 and may cover/contact the front surface 200a of the first device 200 and the front surface 300a of the second device 300. The first molding part 410 may surround the first chip bump 260 and the second chip bump 360 but may expose a top surface of the first chip bump 260 and a top surface of the second chip bump 360. A top surface of the first molding part 410 may be coplanar with the top surface of the first chip bump 260 and the top surface of the second chip bump 360. A bottom surface of the first molding part 410 may be lower than the bottom surface of the first device 200 and the bottom surface of the second device 300. The first molding part 410 may include or be formed of an insulating material such as an epoxy molding compound (EMC).

A first through-electrode 420 may be provided on the first package substrate 100. The first through-electrode 420 may be disposed at a side of the first device 200, at a side of the second device 300, and/or between the first device 200 and the second device 300. For the purpose of ease and convenience in explanation, the first through-electrode 420 disposed at a side of the first device 200 or the second device 300 may be defined as a first sub-through-electrode 422, and the first through-electrode 420 disposed between the first and second devices 200 and 300 may be defined as a second sub-through-electrode 424. The first sub-through-electrode 422 may be disposed at a side of a third device 600 to be described later when viewed in a plan view, and the second sub-through-electrode 424 may be disposed under the third device 600 to be described later. The first through-electrode 420 may vertically penetrate the first molding part 410. The first through-electrode 420 may extend toward the first package substrate 100 and an end of the first through-electrode 420 may be connected to the first substrate interconnection pattern 120 of the first package substrate 100. A bottom surface of the first through-electrode 420 may be coplanar with the bottom surface of the first molding part 410. Another end of the first through-electrode 420 may be exposed at the top surface of the first molding part 410. A top surface of the first through-electrode 420 may be coplanar with the top surface of the first molding part 410, the top surface of the first chip bump 260 and the top surface of the second chip bump 360. A width of the first through-electrode 420 in a horizontal direction may decrease in a direction approaching the first package substrate 100. Alternatively, the width of the first through-electrode 420 may be substantially uniform from its bottom to its top.

A redistribution layer 500 may be provided on the first molding part 410. The redistribution layer 500 may include a plurality of stacked redistribution regions (e.g., sublayers). Each of the redistribution regions may include a redistribution insulating pattern 510 and a redistribution pattern 520 provided in the redistribution insulating pattern 510. The redistribution pattern 520 of one redistribution region may be electrically connected to the redistribution pattern 520 of another redistribution region adjacent thereto. A lowermost redistribution pattern 522 of a lowermost redistribution region may be exposed at a bottom surface of the lowermost redistribution insulating pattern 510, and the exposed portion of the lowermost redistribution pattern 522 may correspond to a first redistribution pad 522 of the redistribution layer 500 (hereinafter, the first redistribution pad and the lowermost redistribution pattern are indicated by the same reference numeral '522' for the purpose of ease and convenience in explanation). An uppermost redistribution pattern 524 of an uppermost redistribution region may be exposed at a top surface of the redistribution insulating pattern 510, and the exposed portion of the uppermost redistribution pattern 524 may correspond to a second redistribution pad 524 of the redistribution layer 500 (hereinafter, the second redistribution pad and the uppermost redistribution pattern are indicated by the same reference numeral '524' for the purpose of ease and convenience in explanation).

The redistribution layer 500 may be electrically connected to the first device 200, the second device 300, and the first through-electrode 420. For example, the first chip bump 260, the second chip bump 360 and the first through-electrode 420 may be electrically/directly connected to tail portions of the first redistribution pads 522 of the redistribution layer 500. The first redistribution pads 522 of the redistribution layer 500 may be in contact with the first chip bump 260, the second chip bump 360 and the first through-electrode 420. The redistribution layer 500 may be electrically/directly connected to the first device 200 through the first chip bump 260, may be electrically/directly connected to the second device 300 through the second chip bump 360 and may be electrically/directly connected to the first package substrate 100 through the first through-electrode 420.

The first device 200 is disposed face-up in FIG. 1. However, embodiments of the inventive concepts are not limited thereto. As illustrated in FIG. 3, a semiconductor package 12 may include a first device 200 disposed face-down on the first package substrate 100. For example, the first device 200 may have a front surface facing the first package substrate 100 and a back surface opposite to the front surface. An integrated device or integrated circuits may be formed in a lower portion of a first base layer 210. A first circuit layer 220 may be provided on a bottom surface of the first base layer 210. The first circuit layer 220 may be electrically connected to the integrated device or integrated circuits formed in the first base layer 210. A bottom surface (i.e., the front surface) of the first device 200, at which the first circuit layer 220 is provided, may be an active surface of the first device 200. A portion of the first circuit pattern 224 may be exposed at a bottom surface of the first circuit layer 220, and the exposed portion of the first circuit pattern 224 of the first circuit layer 220 may correspond to a pad of the first device 200. A first passivation layer 230 may be provided on a top surface of the first base layer 210. The first via 240 may vertically penetrate the first base layer 210 and the first passivation layer 230. One end of the first via 240 may be exposed at a top surface of the first passivation layer 230.

The first device 200 may be mounted on the first package substrate 100. For example, the first circuit layer 220 of the first device 200 may face the first package substrate 100. Here, a first chip terminal 255 may be provided under the first circuit pattern 224 of the first device 200. The first device 200 may be mounted on the first package substrate 100 through the first chip terminal 255. The first chip terminal 255 may electrically connect the first circuit pattern 224 of the first device 200 to the first substrate pad 122 of the first package substrate 100. For example, the first chip terminal 255 may contact the first circuit pattern 224 at its top end and may contact the first substrate pad 122 at its bottom end.

A first molding part 410 may be provided on the first package substrate 100. The first molding part 410 may surround the first device 200 and the second device 300, e.g., in a plan view. The first molding part 410 may cover side surfaces of the first device 200 and side surfaces of the second device 300 and may cover the front surface 300a of the second device 300. A top surface of the first molding part 410 may be coplanar with a top surface of the first device 200. The top surface of the first molding part 410 may be coplanar with the top surface of the second chip bump 360.

The redistribution layer 500 may be electrically connected to the first device 200, the second device 300, and the first through-electrode 420. For example, the first via 240 of the first device 200, the second chip bump 360 of the second device 300 and the first through-electrode 420 may be electrically connected to and/or contact the redistribution patterns 520 of the lowermost redistribution region (e.g., sub-layer) of the redistribution layer 500. Hereinafter, the embodiments of FIGS. 1 and 2 will be described continuously as examples.

Referring again to FIGS. 1 and 2, a third device 600 may be disposed on the redistribution layer 500. The third device 600 may be disposed on a top surface of the redistribution layer 500. The third device 600 may be a semiconductor chip. For example, the third device 600 may be a logic chip. The third device 600 may include or may be a processing unit such as a central processing unit (CPU), a graphic processing unit (GPU), or a neural processing unit (NPU). The third device 600 may be disposed face-down on the redistribution layer 500. For example, the third device 600 may have a front surface facing the redistribution layer 500 and a back surface opposite to the front surface. The third device 600 may vertically overlap with the first device 200 and the second device 300. For example, the third device 600 may cover the first device 200 and the second device 300, e.g., in a plan view. A width of the third device 600 may be greater than a width of the first device 200 and a width of the second device 300. The width of the third device 600 may be greater than a sum of the width of the first device 200 and the width of the second device 300. However, embodiments of the inventive concepts are not limited thereto. In certain embodiments, the sum of the width of the first device 200 and the width of the second device 300 may be greater than the width of the third device 600. The third device 600 may include a third base layer 610 and a third circuit layer 620 provided on a surface of the third base layer 610.

The third base layer 610 may include or be formed of silicon (Si). An integrated device or integrated circuits may be formed in a lower portion of the third base layer 610.

The third circuit layer 620 may be provided on a bottom surface of the third base layer 610. The third circuit layer 620 may be electrically connected to the integrated device or integrated circuits formed in the third base layer 610. For example, the third circuit layer 620 may include a third circuit pattern 624 provided in a third insulating pattern 622, and the third circuit pattern 624 may be electrically/directly connected to the integrated device or integrated circuits formed in the third base layer 610. A portion of the third circuit pattern 624 may be exposed at a bottom surface of the third circuit layer 620, and the exposed portion of the third circuit pattern 624 may correspond to a third chip pad 624 of the third device 600 (hereinafter, the third chip pad and the third circuit pattern will be indicated by the same reference numeral '624' for the purpose of ease and convenience in explanation). A bottom surface (i.e., the front surface) of the third device 600, at which the third circuit layer 620 is provided, may be an active surface of the third device 600.

The third device 600 may be mounted on the redistribution layer 500. For example, the third circuit layer 620 of the third device 600 may face the redistribution layer 500. Here, a second chip terminal (or a second connection terminal) 650 may be provided under the exposed third chip pad 624 of the third circuit pattern 624 of the third device 600. The third device 600 may be mounted on the redistribution layer 500 through the second chip terminal 650. The second chip terminal 650 may electrically connect the third chip pad 624 of the third device 600 to the second redistribution pad 524 of the redistribution layer 500. For example, the second chip terminal 650 may contact the third chip pad 624 on its top surface and may contact the second redistribution pad 524 on its bottom surface. The third device 600 may be electrically/directly connected to the first device 200 and the second device 300 through the second chip terminals 650 and the redistribution layer 500. The third device 600 may be electrically/directly connected to the first package substrate 100 through the second chip terminal 650, the redistribution layer 500 and the second sub-through-electrode 424.

According to the embodiments of the inventive concepts, the first device 200, the second device 300 and the third device 600 may be mounted directly and/or electrically connected to the redistribution layer 500, e.g., without using wire bonding, e.g., with flip-chip bonding method. For example, the active surface of the first device 200 and the active surface of the second device 300 may face the active surface of the third device 600, and the first device 200 and the second device 300 may be electrically/directly connected to the third device 600 by using only the redistribution layer 500. Thus, electrical connection distances between the third device 600 and the first and second devices 200 and 300 may be reduced or shortened (e.g., comparing with other connection structures/methods), and electrical characteristics of a semiconductor package 10 may be improved.

In addition, the third device 600 may be connected directly/electrically to the first package substrate 100 by using the first through-electrode 420, and thus an electrical connection distance between the third device 600 and the first package substrate 100 may be shortened. For example, the third device 600 may be electrically connected to the first package substrate 100 through the first through-electrode 420 without any intervening semiconductor chips in the electrical signal path therebetween.

Furthermore, the first and second devices 200 and 300 having small sizes may be disposed under the third device 600 having a large size, and thus an area required for arrangement of the first to third devices 200, 300 and 600 may be reduced. As a result, a small semiconductor package may be realized.

A second molding part 430 may be provided on the redistribution layer 500. The second molding part 430 may cover the top surface of the redistribution layer 500. The second molding part 430 may surround the third device 600, e.g., in a plan view. The second molding part 430 may cover side surfaces of the third device 600 and may cover the back surface of the third device 600. The second molding part 430 may include or be formed of an insulating material such as an epoxy molding compound (EMC).

A second through-electrode 440 may be provided on the redistribution layer 500. The second through-electrode 440 may be disposed at a side of the third device 600. The second through-electrode 440 may vertically penetrate the second molding part 430. The second through-electrode 440 may extend toward the redistribution layer 500 to be electrically connected to the redistribution pattern 520 of the redistribution layer 500. For example, and end of the second through-electrode 440 may contact the redistribution pattern 520. A bottom surface of the second through-electrode 440 may be coplanar with a bottom surface of the second molding part 430. Another end of the second through-electrode 440 may be exposed at a top surface of the second molding part 430. A top surface of the second through-electrode 440 may be coplanar with the top surface of the second molding part 430. A width of the second through-electrode 440 may decrease in a direction approaching the redistribution layer 500. Alternatively, the width of the second through-electrode 440 may be substantially uniform from its bottom to its top. The second through-electrode 440 may be electrically/directly connected to the first package substrate 100 through the redistribution layer 500 and the first sub-through-electrode 422.

A second package substrate 700 may be provided on the second molding part 430. The second package substrate 700 may include or be formed of one or more substrate interconnection layers sequentially stacked. Each of the substrate interconnection layers may include a second substrate insulating layer 710 and a second substrate interconnection pattern 720 in the second substrate insulating layer 710. The second substrate interconnection pattern 720 of one substrate interconnection layer may be electrically connected to the second substrate interconnection pattern 720 of another substrate interconnection layer adjacent thereto.

The second substrate insulating layer 710 may include or be formed of an insulating polymer or a photoimageable dielectric (PID). For example, the photoimageable dielectric (PID) may include at least one of photosensitive polyimide, polybenzoxazole (PBO), a phenol-based polymer, or a benzocyclobutene-based polymer.

The second substrate interconnection pattern 720 may be provided in the second substrate insulating layer 710. The second substrate interconnection pattern 720 may have a damascene structure. For example, the second substrate interconnection pattern 720 may have a T-shaped cross section. The second substrate interconnection pattern 720 of a lowermost one of the substrate interconnection layers may be electrically connected to and/or contact the second through-electrode 440. The second substrate interconnection pattern 720 may include or be formed of a conductive material. For example, the second substrate interconnection pattern 720 may include or be formed of copper (Cu).

The second package substrate 700 may be omitted as necessary.

The semiconductor package 10 may be provided as described above.

Figure 4:
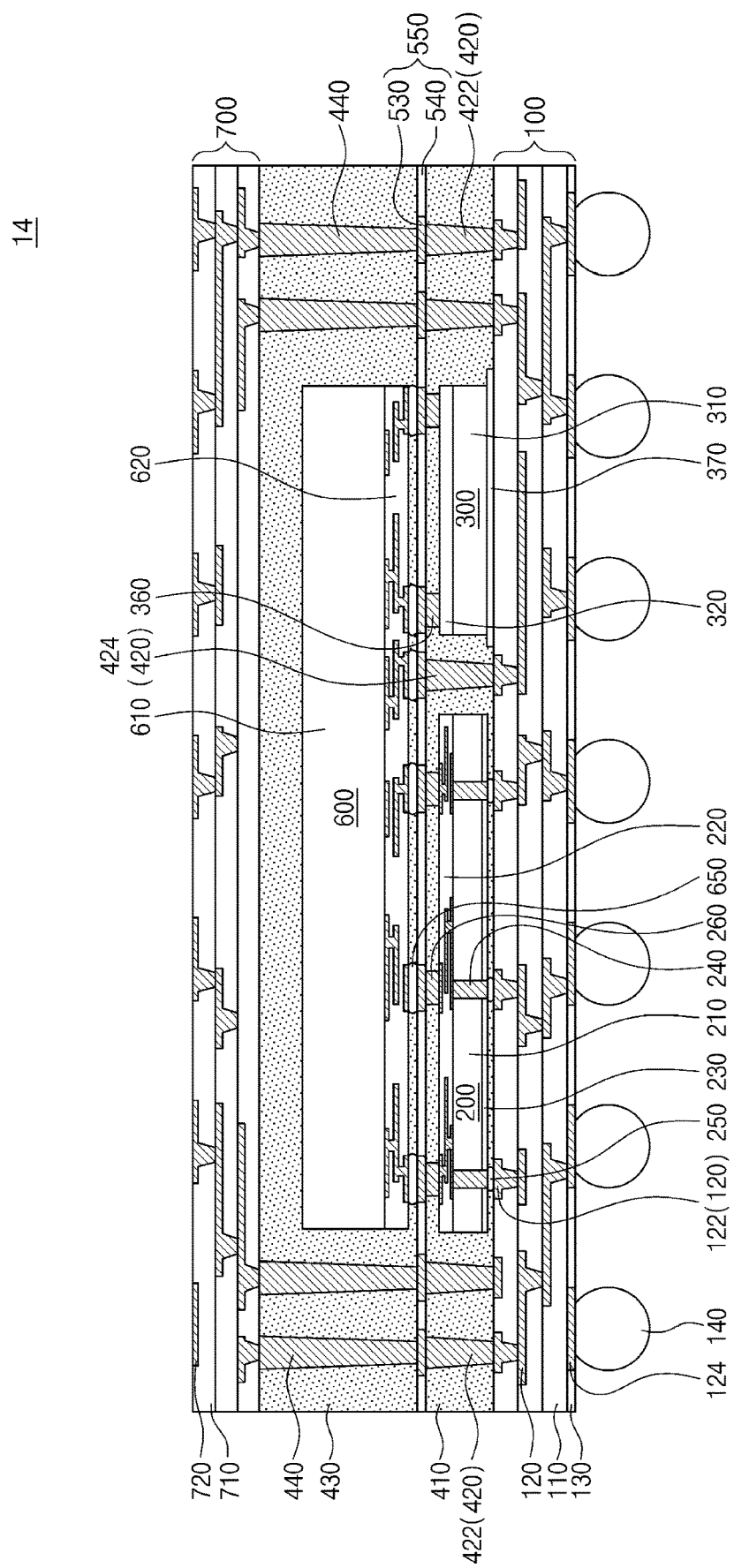
FIGS. 4 and 5 illustrate cross-sectional views showing semiconductor packages according to some example embodiments of the present inventive concepts.

FIG. 4 illustrates a cross-sectional view showing a semiconductor package according to some example embodiments of the present inventive concepts.

Referring to FIG. 4, a semiconductor package 14 may not include the redistribution layer 500 of FIG. 1.

An intermediate layer 550 may be disposed between the first molding part 410 and the second molding part 430. The intermediate layer 550 may include an intermediate insulating layer 540 and intermediate pads 530.

The intermediate pads 530 may be disposed on the top surface of the first molding part 410. The intermediate pads 530 may be electrically/directly connected to the first device 200, the second device 300 and the first through-electrodes 420. For example, a first intermediate pad of the intermediate pads 530 may be located on the first chip bump 260 of the first device 200. A second intermediate pad of the intermediate pads 530 may be located on the second chip bump 360 of the second device 300. A third intermediate pad of the intermediate pads 530 may be located on the first through-electrode 420. The intermediate pads 530 may include or be formed of a conductive material such as copper (Cu). Even though not shown in the drawings, a seed layer may be provided on a bottom surface of each of the intermediate pads 530. For example, the seed layers may be disposed between the first molding part 410 and the intermediate pads 530, between the first device 200 and the intermediate pads 530 and between the second device 300 and the intermediate pads 530.

The intermediate insulating layer 540 may be disposed on the first molding part 410. The intermediate insulating layer 540 may surround the intermediate pads 530, e.g., in a plan view. Top surfaces of the intermediate pads 530 may be exposed at a top surface of the intermediate insulating layer 540. For example, the top surfaces of the intermediate pads 530 may be coplanar with the top surface of the intermediate insulating layer 540. The intermediate insulating layer 540 may include or be formed of a photoimageable dielectric (PID). For example, the photoimageable dielectric (PID) may include or be formed of at least one of photosensitive polyimide, polybenzoxazole (PBO), a phenol-based polymer, and a benzocyclobutene-based polymer.

The third device 600 may be disposed on the intermediate layer 550. The third device 600 may be disposed on a top surface of the intermediate layer 550. The third device 600 may be disposed face-down on the intermediate layer 550. The third device 600 may include the third base layer 610 and the third circuit layer 620 provided on a surface of the third base layer 610.

The third device 600 may be mounted on the intermediate layer 550. For example, the third circuit layer 620 of the third device 600 may face the intermediate layer 550. The second chip terminals 650 may be provided under the exposed third circuit patterns of the third device 600. The third device 600 may be mounted on the intermediate pads 530 of the intermediate layer 550 through the second chip terminals 650. The second chip terminals 650 may electrically/directly connect the third circuit layer 620 of the third device 600 to the intermediate pads 530 of the intermediate layer 550.

The second molding part 430 may be provided on the intermediate layer 550. The second molding part 430 may cover the top surface of the intermediate layer 550. The second molding part 430 may surround the third device 600, e.g., in a plan view.

The second through-electrode 440 may be provided on the intermediate layer 550. The second through-electrode 440 may be disposed at a side of the third device 600. For example, the second through-electrode 440 may be laterally spaced apart from the third device 600. The second through-electrode 440 may vertically penetrate the second molding part 430. The second through-electrode 440 may extend toward the intermediate layer 550 to be electrically connected to the intermediate pad 530 of the intermediate layer 550. For example, an end of the second through-electrode 440 may contact the intermediate pad 530.

According to the embodiments of the inventive concepts, the first device 200, the second device 300 and the third device 600 may be mounted directly and/or electrically connected to the intermediate layer 550 without using wire bonding, e.g., using flip-chip bonding method. For example, the active surface of the first device 200 and the active surface of the second device 300 may face the active surface of the third device 600, and the first device 200 and the second device 300 may be electrically/directly connected to the third device 600 by using only the intermediate layer 550. Thus, electrical connection distances between the third device 600 and the first and second devices 200 and 300 may be reduced or shortened (e.g., comparing with other connection structures/methods), and electrical characteristics of the semiconductor package 14 may be improved.

In addition, the first device 200 and the second device 300 may be electrically/directly connected to the third device 600 by using the intermediate pads 530 provided in a single layer, and thus distances between the third device 600 and the first and second devices 200 and 300 may be reduced/minimized. As a result, a small semiconductor package may be realized.

Figure 5:
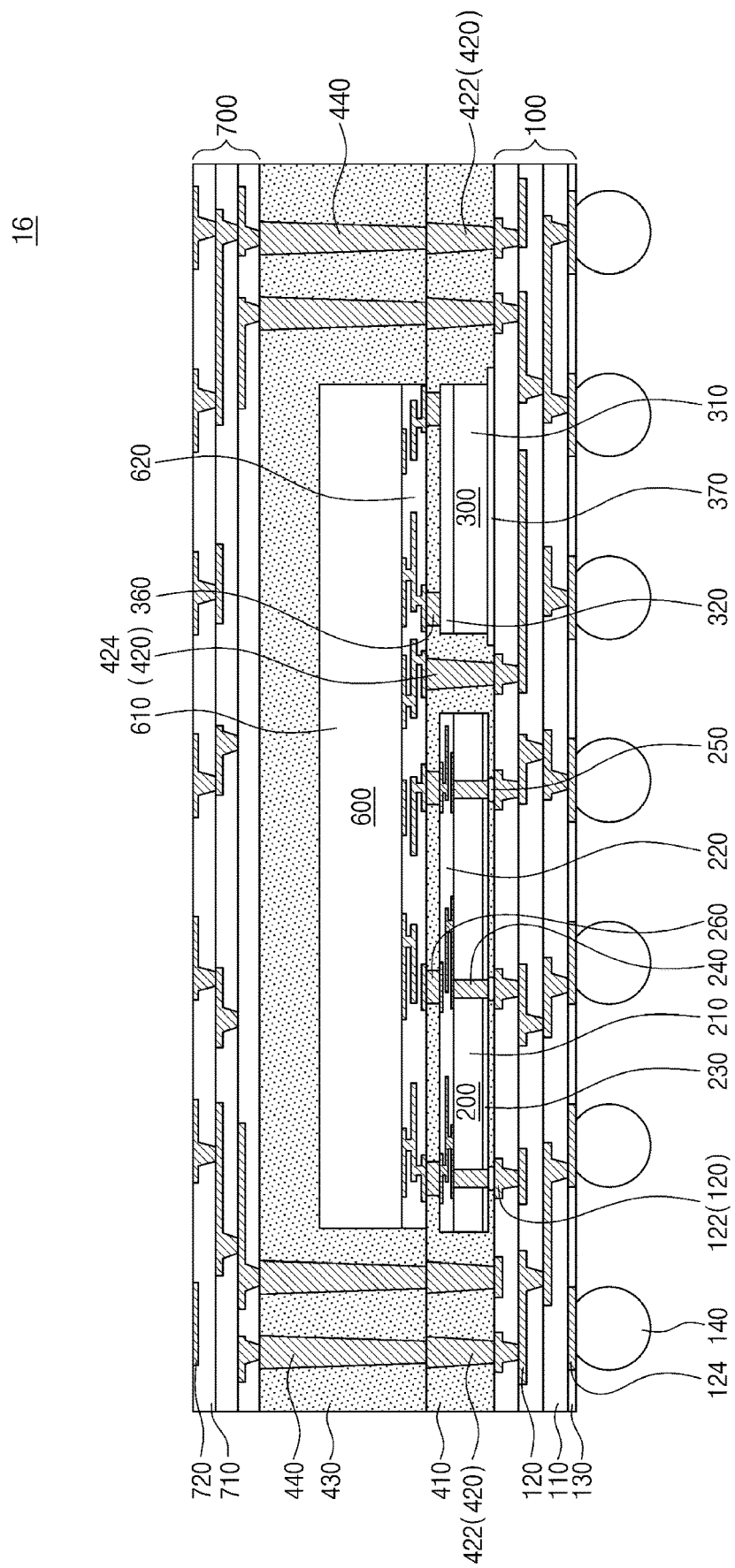

FIG. 5 illustrates a cross-sectional view showing a semiconductor package according to some example embodiments of the present inventive concepts.

Referring to FIG. 5, a semiconductor package 16 may not include the redistribution layer 500 of FIG. 1.

The third device 600 may be disposed on the first molding part 410. The third device 600 may be disposed on the top surface of the first molding part 410. The bottom surface of the third device 600 may be in contact with the top surface of the first molding part 410. The third device 600 may be disposed face-down on the first molding part 410. The third device 600 may include the third base layer 610 and the third circuit layer 620 provided on a surface of the third base layer 610.

The third device 600 may be electrically connected to the first device 200, the second device 300 and the first through-electrode 420. For example, the exposed third circuit patterns of the third device 600 may be in contact with the first chip bump 260 of the first device 200, the second chip bump 360 of the second device 300 and the first through-electrode 420.

The second molding part 430 may be provided on the first molding part 410. The second molding part 430 may be in contact with the top surface of the first molding part 410. The second molding part 430 may surround the third device 600, e.g., in a plan view.

The second through-electrode 440 may be provided on the first molding part 410. The second through-electrode 440 may be disposed at a side of the third device 600. For example, the second through-electrode may be laterally spaced apart from the third device 600. The second through-electrode 440 may vertically penetrate the second molding part 430. The second through-electrode 440 may extend toward the first package substrate 100 to be in contact with the first sub-through-electrode 422 of the first through-electrodes 420. For example, an end of the second through-electrode 440 may contact the first sub-through electrode 422.

According to the embodiments of the inventive concepts, the first device 200 and the second device 300 may be mounted directly and/or electrically connected to the third device 600 without wire bonding, e.g., with flip-chip bonding method as shown in FIG. 5. For example, the active surface of the first device 200 and the active surface of the second device 300 may face the active surface of the third device 600, and the first chip bump 260 of the first device 200 and the second chip bump 360 of the second device 300 may be connected directly to the third circuit layer 620 of the third device 600. Thus, electrical connection distances between the third device 600 and the first and second devices 200 and 300 may be reduced or shortened (e.g., comparing with other type of connections between semiconductor chips), and electrical characteristics of the semiconductor package 16 may be improved.

In addition, the first and second devices 200 and 300 may be connected directly to the third device 600 without an additional intermediate component, and thus a small semiconductor package may be realized.

Figure 6:
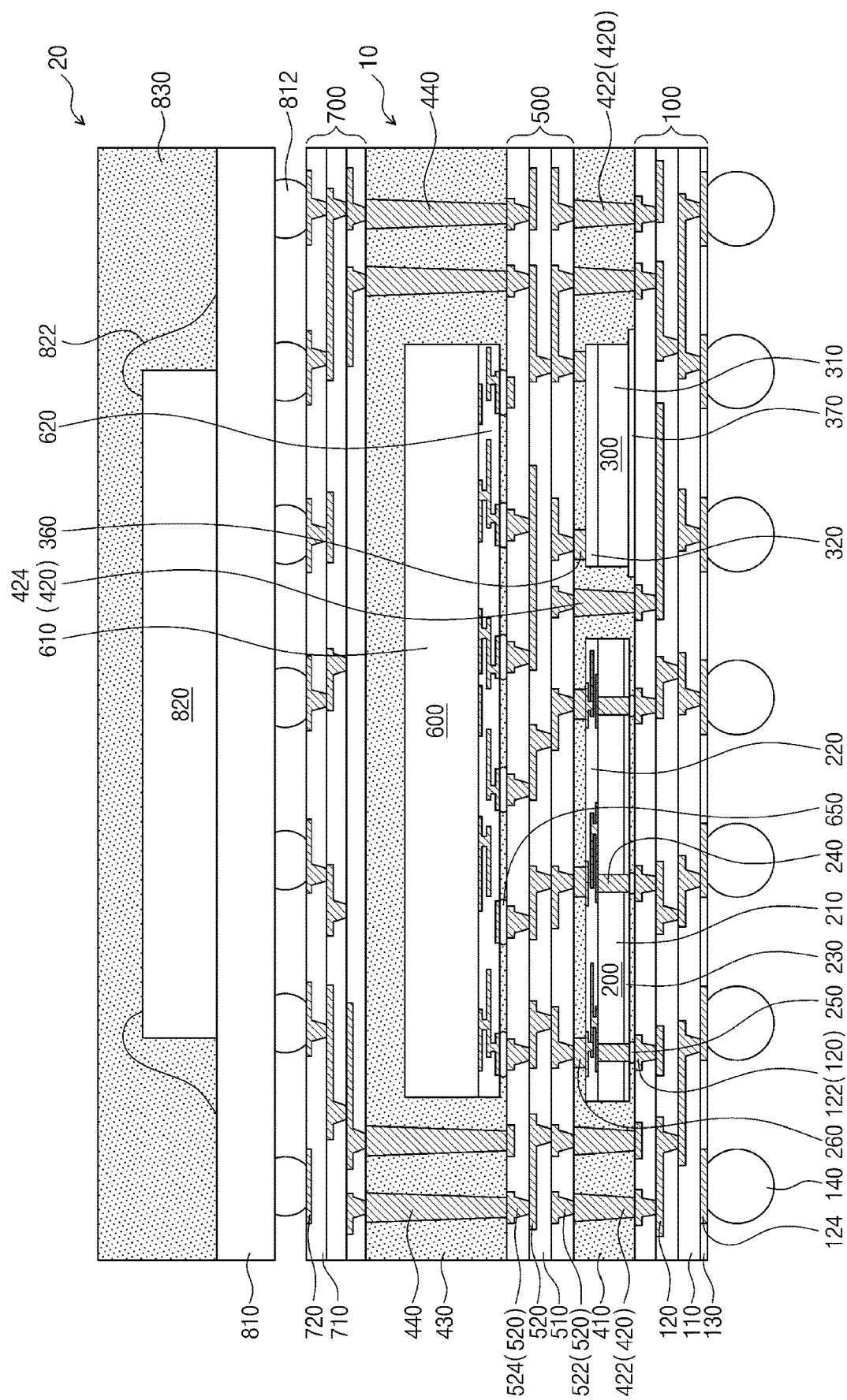
FIGS. 6 to 8 illustrate cross-sectional views showing semiconductor packages according to some example embodiments of the present inventive concepts.

FIG. 6 illustrates a cross-sectional view showing a semiconductor package according to some example embodiments of the present inventive concepts.

Referring to FIG. 6, a semiconductor package may include a lower package 10 and an upper package 20. For example, the semiconductor package may be a package-on-package (PoP) in which the upper package 20 is mounted on the lower package 10.

The lower package 10 may have the same or similar structure as the semiconductor package 10 of FIGS. 1 and 2, the semiconductor package 12 of FIG. 3, the semiconductor package 14 of FIG. 4 or the semiconductor package 16 of FIG. 5. The descriptions to the semiconductor packages of FIGS. 1 to 5 may also be applied to the lower package 10.

The upper package 20 may include an upper package substrate 810, an upper semiconductor chip 820, and an upper molding part 830.

The upper package substrate 810 may be disposed on the second package substrate 700. Here, the upper package substrate 810 may be vertically spaced apart from the second package substrate 700. For example, an air gap may be formed between the upper package substrate 810 and the second package substrate 700 as shown in FIG. 6. The upper package substrate 810 may be a printed circuit board (PCB) having conductive patterns. Alternatively, the upper package substrate 810 may have a structure in which insulating layers and interconnection layers are alternately stacked.

The upper package substrate 810 may be mounted on the second package substrate 700. For example, substrate terminals (or package connection terminals) 812 may be disposed under the upper package substrate 810. For example, the upper package substrate 810 may be electrically connected to the second package 700 through the substrate terminals 812 interposed therebetween. For example, the substrate terminals 812 may contact the second substrate interconnection patterns 720 of the second package substrate 700. The substrate terminals 812 may include or may be solder balls or solder bumps.

At least one upper semiconductor chip 820 may be disposed on the upper package substrate 810. When a plurality of upper semiconductor chips 820 are provided in the upper package 20, the upper semiconductor chips 820 may be spaced apart from each other, e.g., in a plan view. For example, the upper semiconductor chips 820 may be laterally spaced apart from each other. The upper semiconductor chip 820 may be mounted on a top surface of the upper package substrate 810. For example, the upper semiconductor chip 820 may be mounted on substrate pads of the upper package substrate 810 by a wire bonding method. In certain embodiments, the upper semiconductor chip 820 may be electrically connected to the upper package substrate 810 by bonding wires 822. However, embodiments of the inventive concepts are not limited thereto. In certain embodiments, the upper semiconductor chip 820 may be mounted on the upper package substrate 810 by other mounting component(s) such as solder balls or solder bumps. For example, the upper semiconductor chip 820 may be a logic chip or a memory chip. The upper semiconductor chip 820 may be electrically connected to the external terminals 140 of the first package substrate 100 through the upper package substrate 810, the second package substrate 700, the second through-electrode 440, the redistribution layer 500 and the first through-electrode 420 and may be electrically connected to the first, second and third devices 200, 300 and 600 through the upper package substrate 810, the second package substrate 700, the second through-electrode 440 and the redistribution layer 500. A single upper semiconductor chip 820 is illustrated in FIG. 6. However, two or more upper semiconductor chips 820 may be provided in the upper package 20.

The upper molding part 830 may be provided on the upper package substrate 810. The upper molding part 830 may surround the upper semiconductor chip 820 on the top surface of the upper package substrate 810. For example, the upper semiconductor chip 820 may be embedded in the upper molding part 830 on the upper package substrate 810.

Figure 7:
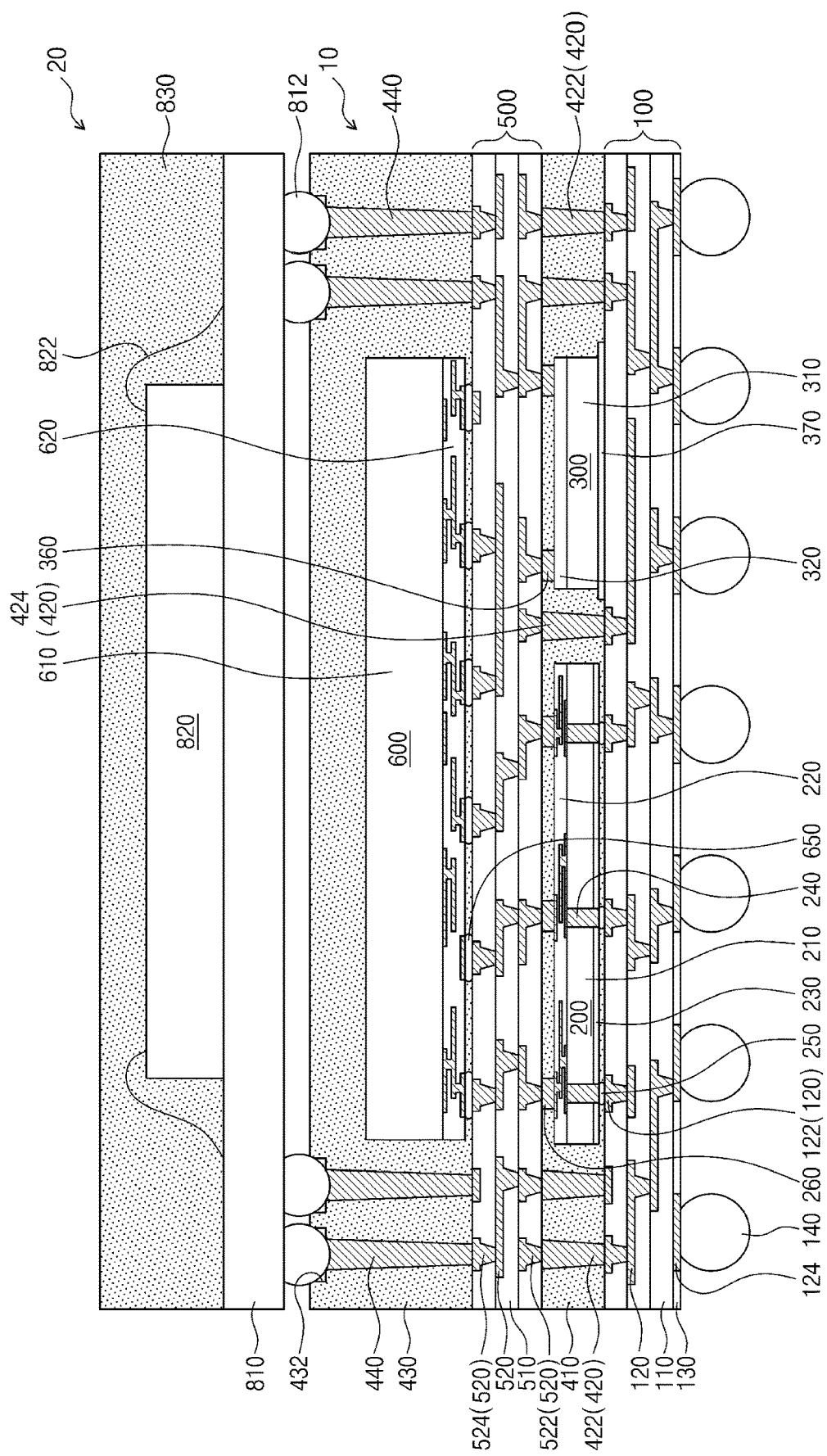

FIG. 7 illustrates a cross-sectional view showing a semiconductor package according to some example embodiments of the present inventive concepts.

Referring to FIG. 7, the lower package 10 may not include the second package substrate 700 of FIG. 6.

The second molding part 430 may have recess regions 432 formed in the top surface of the second molding part 430. The recess regions 432 may be located on the second through-electrodes 440. For example, top surfaces of the second through-electrodes 440 may be exposed at bottom surfaces of the recess regions 432.

The upper package substrate 810 may be disposed on the second molding part 430. The upper package substrate 810 may be vertically spaced apart from the second molding part 430. For example, an air gap may be formed between the upper package substrate 810 and the second molding part 430 as shown in FIG. 6. The upper package substrate 810 may be electrically/directly connected to the second through-electrodes 440. For example, substrate terminals 812 may be disposed under the upper package substrate 810. The substrate terminals 812 may be inserted in the recess regions 432 of the second molding part 430 to be electrically connected to the second through-electrodes 440. For example, the substrate terminals 812 may contact the second through-electrodes 440.

Figure 8:
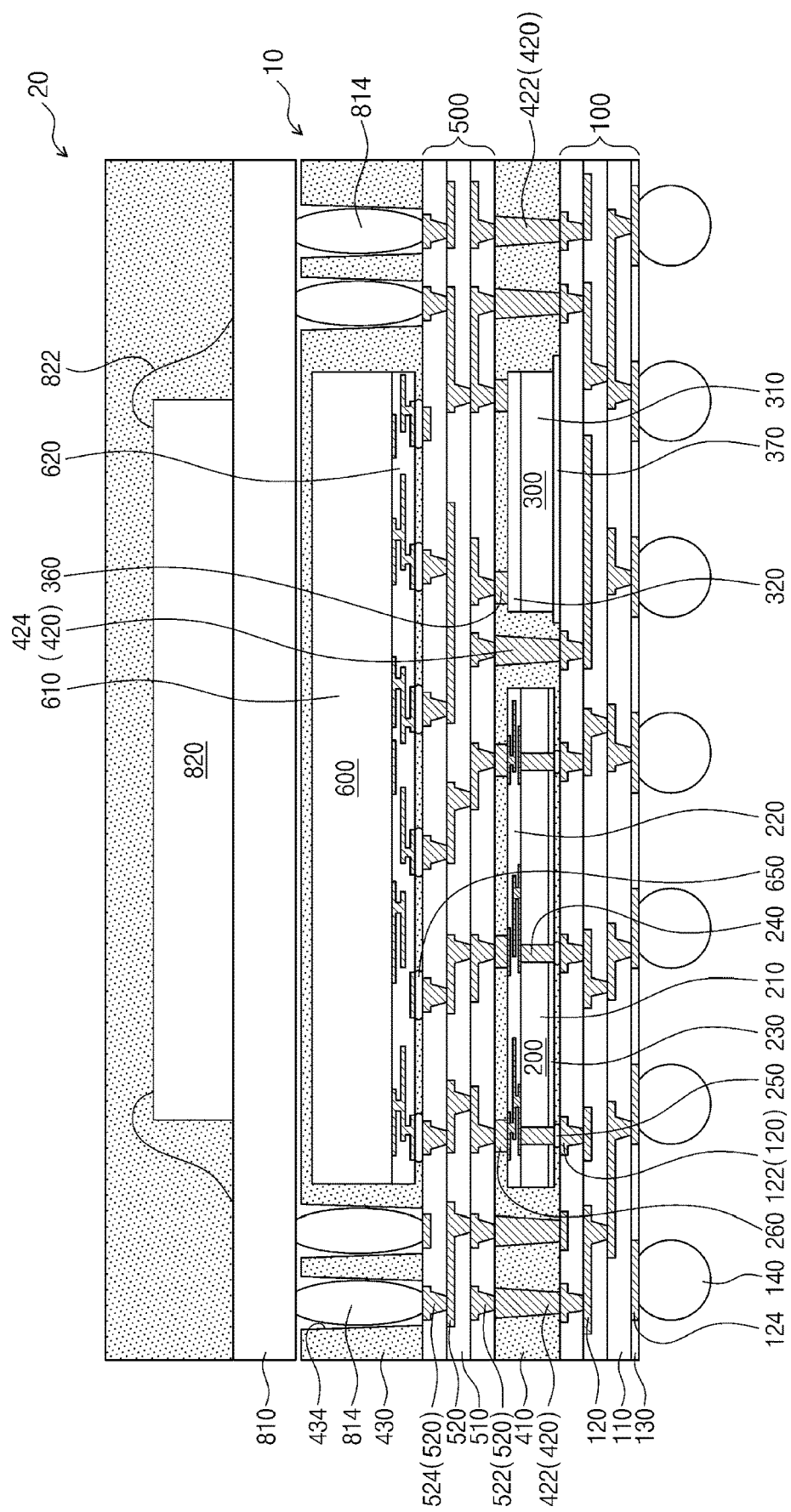

FIG. 8 illustrates a cross-sectional view showing a semiconductor package according to some example embodiments of the present inventive concepts.

Referring to FIG. 8, the lower package 10 may not include the second package substrate 700 of FIG. 6 and the second through-electrode 440 of FIG. 6.

The second molding part 430 may have through-holes 434 vertically penetrating the second molding part 430. The through-holes 434 may expose the top surface of the redistribution layer 500 (e.g., the redistribution pads 524 of the redistribution layer 500).

The upper package substrate 810 may be disposed on the second molding part 430. The upper package substrate 810 may be vertically spaced apart from the second molding part 430. For example, an air gap may be formed between the upper package substrate 810 and the second molding part 430 as shown in FIG. 8. The upper package substrate 810 may be electrically/directly connected to the redistribution layer 500. For example, substrate terminals 814 may be disposed under the upper package substrate 810. The substrate terminals 814 may be inserted in the through-holes 434 of the second molding part 430 to be electrically connected to and/or contact the redistribution pads 524 of the redistribution layer 500.

FIGS. 9 to 16 illustrate cross-sectional views showing a method of manufacturing a semiconductor package according to some example embodiments of the present inventive concepts.

Figure 9:
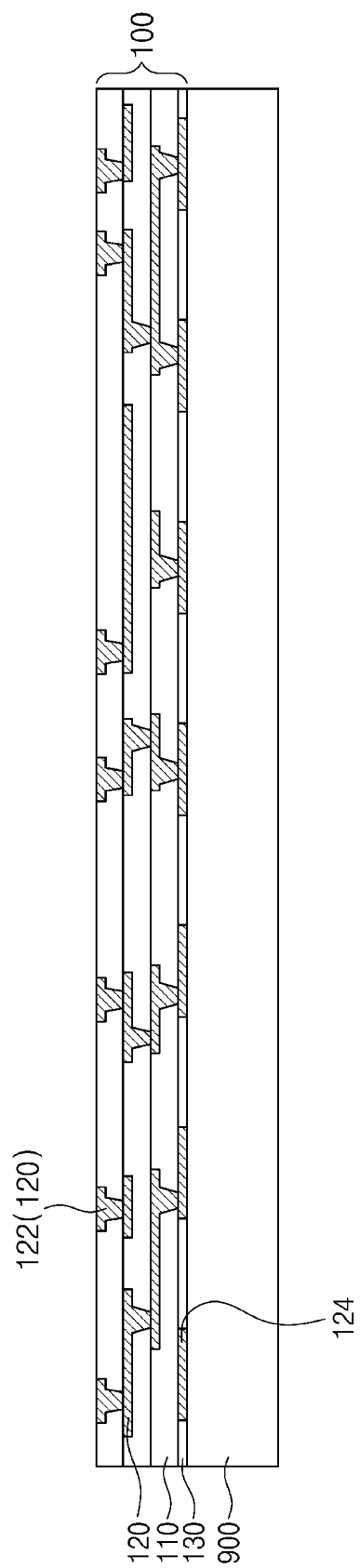
FIGS. 9 to 18 illustrate cross-sectional views showing methods of manufacturing a semiconductor package according to some example embodiments of the present inventive concepts.

Referring to FIG. 9, a carrier substrate 900 may be provided. The carrier substrate 900 may be an insulating substrate including or made of a glass or a polymer or may be a conductive substrate including or made of a metal. Even though not shown in the drawings, the carrier substrate 900 may have an adhesive member provided on a top surface of the carrier substrate 900. For example, the adhesive member may include or may be an adhesive tape.

A first package substrate 100 may be formed on the carrier substrate 900. Hereinafter, the formation of the first package substrate 100 will be described in detail.

A lower insulating layer 130 may be provided on the carrier substrate 900. The lower insulating layer 130 may include or be formed of an insulating polymer or a photo-imageable dielectric (PID). The lower insulating layer 130 may correspond to the substrate passivation layer 130 described with reference to FIG. 1.

Second substrate pads 124 may be formed in the lower insulating layer 130. For example, the lower insulating layer 130 may be patterned to form openings for forming the second substrate pads 124, a seed layer may be conformally formed in each of the openings, and a plating process using the seed layer as a seed may be performed to form the second substrate pad 124 filling each of the openings.

A first substrate insulating layer 110 may be formed on the lower insulating layer 130. The first substrate insulating layer 110 may be formed by a coating process such as a spin coating process or a slit coating process. The first substrate insulating layer 110 may include or be formed of a photo-imageable dielectric (PID). For example, the photoimageable dielectric (PID) may include or be formed of at least one of photosensitive polyimide, polybenzoxazole (PBO), a phenol-based polymer, and a benzocyclobutene-based polymer.

Openings may be formed in the first substrate insulating layer 110. For example, the first substrate insulating layer 110 may be patterned to form the openings. Each of the openings may have a T-shaped cross section. Each of the openings may expose the second substrate pad 124.

First substrate interconnection patterns 120 may be formed. For example, a barrier layer and a conductive layer may be formed on the first substrate insulating layer 110 to fill the openings, and then, a planarization process may be performed on the conductive layer and the barrier layer to form the first substrate interconnection patterns 120.

A substrate interconnection layer having the first substrate insulating layer 110 and the first substrate interconnection patterns 120 may be formed as described above. The process of forming the substrate interconnection layer may be repeated to form the first package substrate 100 in which the substrate interconnection layers are stacked. The first substrate interconnection pattern 120 of an uppermost one of the substrate interconnection layers may correspond to a first substrate pad 122 of the first package substrate 100.

Figure 10:
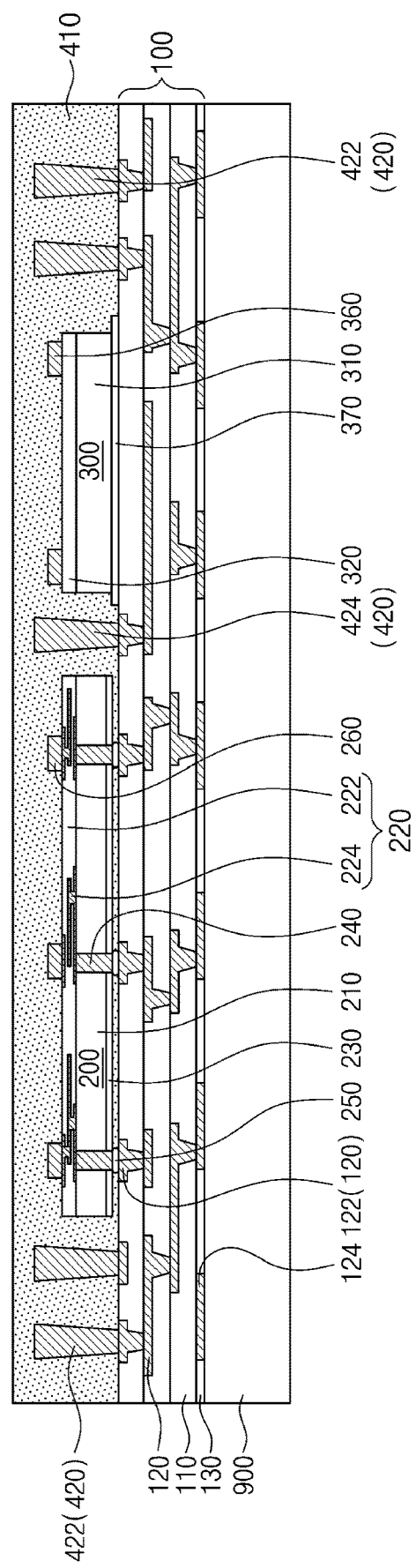

Referring to FIG. 10, first through-electrodes 420 may be formed on the first package substrate 100. For example, a sacrificial layer may be formed on the first package substrate 100, via holes penetrating the sacrificial layer to expose the first substrate pads 122 may be formed, and then, the first through-electrodes 420 may be formed by filling the via holes with a conductive material. Thereafter, the sacrificial layer may be removed.

A first device 200 may be provided. Components of the first device 200 may be the same as or similar to those described with reference to FIG. 1. For example, the first device 200 may include a first base layer 210, a first circuit layer 220 provided on an active surface of the first base layer 210, a first passivation layer 230 provided on an inactive surface of the first base layer 210, and first vias 240 penetrating the first base layer 210 and the first passivation layer 230 to be connected to the first circuit layer 220.

First chip bumps 260 may be formed on the first device 200. For example, a mask pattern having openings exposing first circuit patterns 224 of the first circuit layer 220 may be formed on the first circuit layer 220, a seed layer may be conformally formed in each of the openings, and a plating process using the seed layer as a seed may be performed to form the first chip bumps 260 filling the openings, respectively.

The first device 200 may be mounted on the first package substrate 100. For example, first chip terminals 250 may be provided on the first vias 240 of the first device 200. The first device 200 may be aligned in such a way that the first chip terminals 250 are located on the first substrate pads 122 of the first package substrate 100, and then, a reflow process may be performed to connect the first chip terminals 250 to the first vias 240 and the first substrate pads 122. For example, the first chip terminals 250 and the first vias 240 may be connected by a reflow soldering process.

A second device 300 may be provided. Components of the second device 300 may be the same as or similar to those described with reference to FIG. 1. For example, the second device 300 may include a second base layer 310 and a second circuit layer 320 provided on an active surface of the second base layer 310.

Second chip bumps 360 may be formed on the second device 300. For example, a mask pattern having openings exposing circuit patterns of the second circuit layer 320 may be formed on the second circuit layer 320, a seed layer may be conformally formed in each of the openings, and a plating process using the seed layer as a seed may be performed to form the second chip bumps 360 filling the openings, respectively.

The second device 300 may be adhered onto the first package substrate 100. For example, an adhesive film 370 may be provided on an inactive surface of the second base layer 310 of the second device 300. The second device 300 may be located on the first package substrate 100, and then, the second device 300 may be pressed on the first package substrate 100.

A first molding part 410 may be formed on the first package substrate 100. For example, a molding material may be formed on the top surface of the first package substrate 100 to cover the first device 200 and the second device 300, and the molding material may be hardened to form the first molding part 410. The first molding part 410 may cover and/or contact a top surface and side surfaces of the first device 200, a top surface and side surfaces of the second device 300, and top surfaces and side surfaces of the first and second chip bumps 260 and 360. The first molding part 410 may surround the first through-electrode 420.

Figure 11:
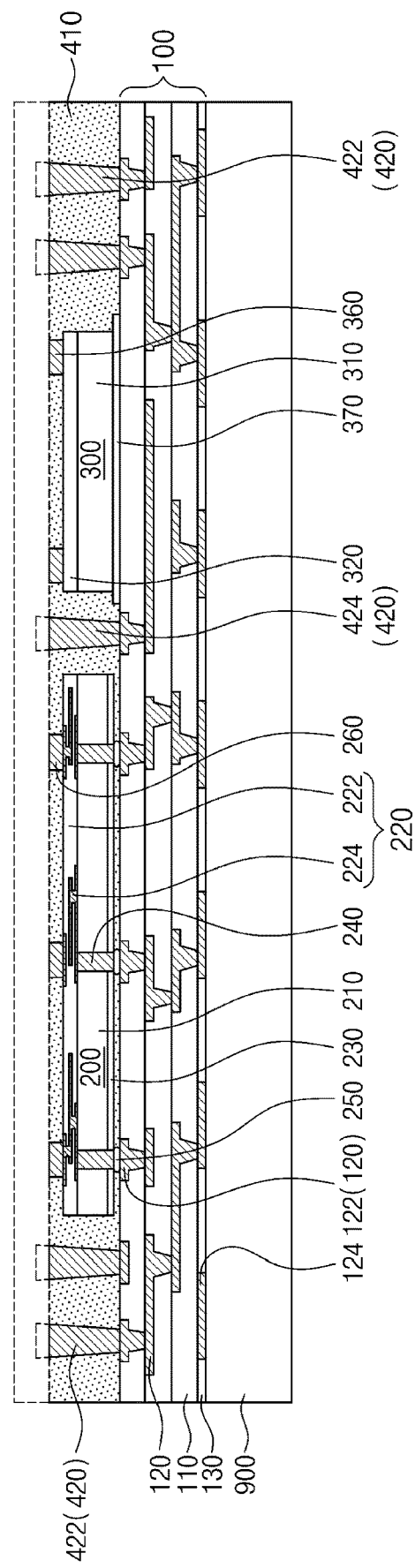

Referring to FIG. 11, a portion of the first molding part 410 may be removed. For example, the first molding part 410 may be thinned. For example, a grinding process or a chemical mechanical polishing (CMP) process may be performed on a top surface of the first molding part 410. Thus, the top surface of the first molding part 410 may be planarized. The thinning process may be performed until the top surfaces of the first and second chip bumps 260 and 360 are exposed. An upper portion of the first molding part 410 may be removed by the thinning process. Upper portions of the first chip bumps 260, upper portions of the second chip bumps 360 and upper portions of the first through-electrodes 420 may also be removed by the thinning process as necessary.

After the thinning process, the first chip bumps 260 and the second chip bumps 360 may be exposed at a top surface of the first molding part 410. After the thinning process, top surfaces of the first through-electrodes 420 may be exposed. The top surfaces of the first chip bumps 260, the top surfaces of the second chip bumps 360, the top surfaces of the first through-electrodes 420 and the top surface of the first molding part 410 may be substantially flat and may be substantially coplanar with each other.

Figure 12:
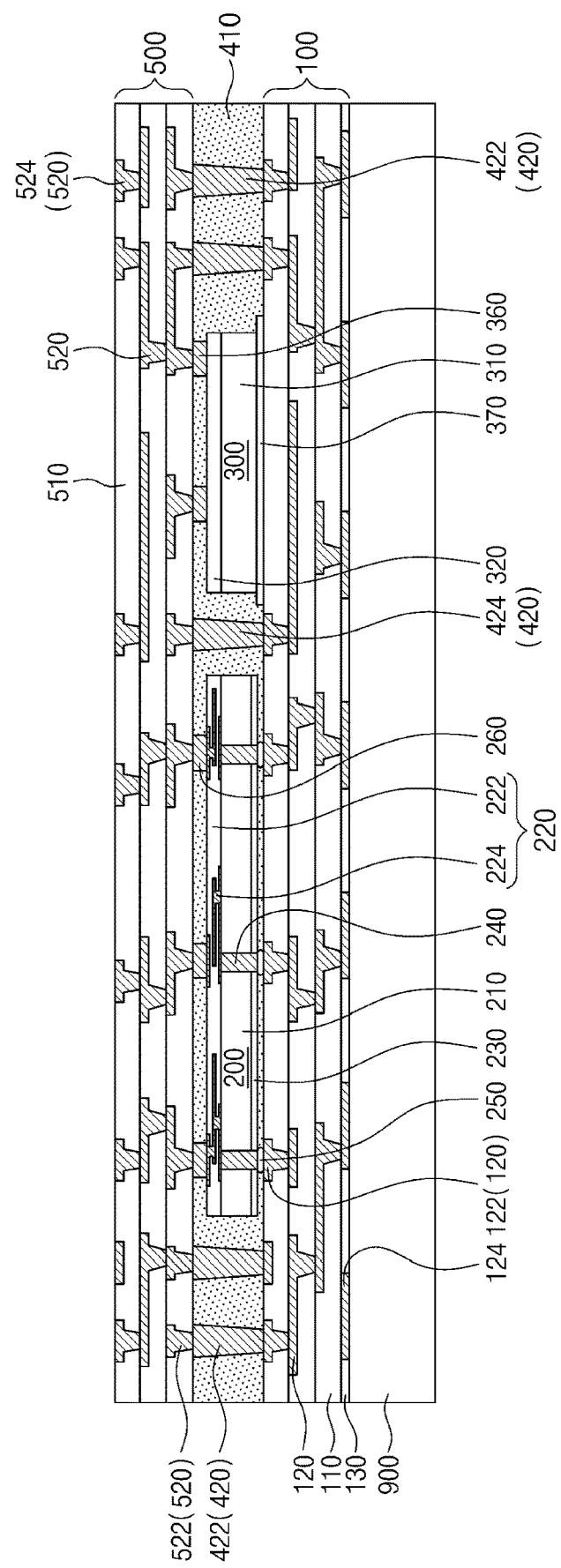
Figure 13:
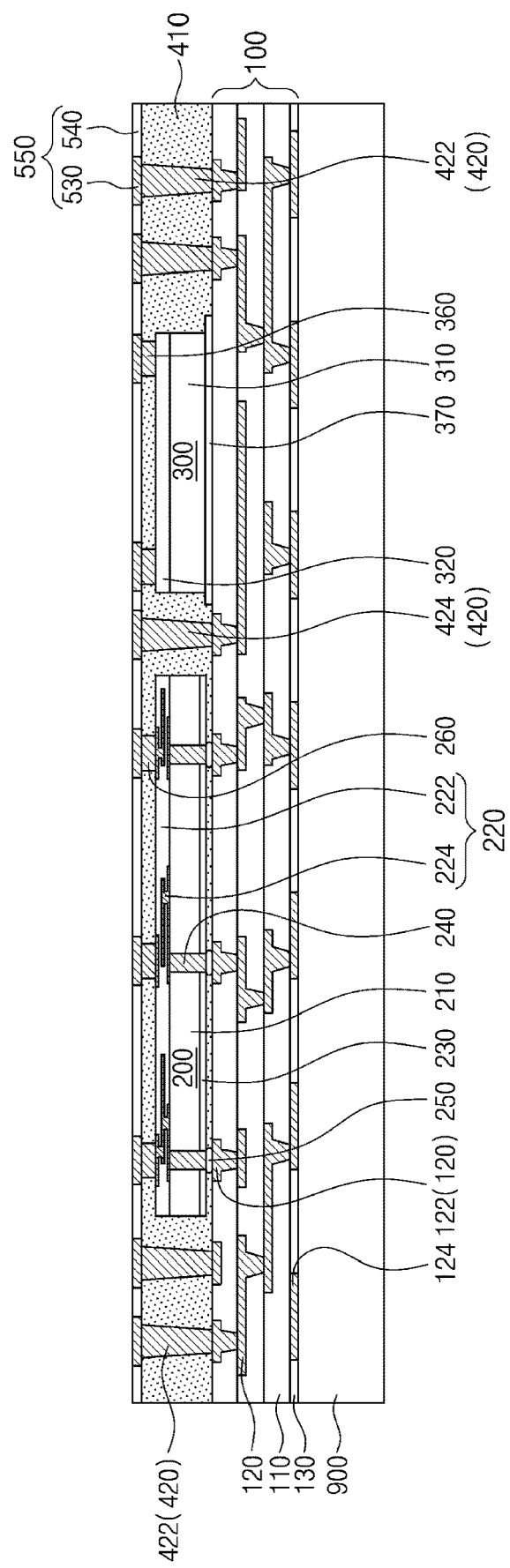

Referring to FIG. 12, a redistribution layer 500 may be formed on the first molding part 410. For example, a redistribution insulating pattern 510 may be formed on the first molding part 410. The redistribution insulating pattern 510 may include or be formed of an insulating polymer or a photoimageable dielectric (PID). Redistribution patterns 520 may be formed in the redistribution insulating pattern 510. For example, the redistribution insulating pattern 510 may be patterned to form openings for forming the redistribution patterns 520, a seed layer may be conformally formed in each of the openings, and a plating process may be performed using the seed layer as a seed to form the redistribution patterns 520 filling the openings. The openings may expose the first through-electrodes 420, the first chip bumps 260, and the second chip bumps 360. Thus, the redistribution patterns 520 may be electrically connected to and/or contact the first through-electrodes 420, the first chip bumps 260, and the second chip bumps 360. One redistribution region (e.g., a redistribution sub-layer) may be formed as described above.

Another redistribution insulating pattern 510 may be formed on the one redistribution region. The other redistribution insulating pattern 510 may be formed by a coating process such as a spin coating process or a slit coating process. The other redistribution insulating pattern 510 may include or be formed of a photoimageable dielectric (PID). Openings exposing the redistribution patterns 520 of the one redistribution region provided thereunder may be formed in the other redistribution insulating pattern 510, a seed layer may be conformally formed in each of the openings, and a plating process may be performed using the seed layer as a seed to form redistribution patterns 520 filling the openings. As described above, other redistribution regions (e.g., sub-layers) may be formed on the one redistribution region. An uppermost redistribution pattern 524 of an uppermost redistribution region may be exposed at a top surface of the redistribution insulating pattern 510, and the exposed portion of the uppermost redistribution pattern 524 may correspond to a second redistribution pad 524 of the redistribution layer 500 (hereinafter, the second redistribution pad and the uppermost redistribution pattern are indicated by the same reference numeral '524' for the purpose of ease and convenience in explanation).

However, the inventive concepts are not limited to the above embodiments in which the redistribution layer 500 is formed.

In certain embodiments, an intermediate layer 550 may be formed on the first molding part 410. For example, an intermediate insulating layer 540 may be formed on the first molding part 410. The intermediate insulating layer 540 may include or be formed of an insulating polymer or a photo-imageable dielectric (PID). Intermediate pads 530 may be formed in the intermediate insulating layer 540. For example, the intermediate insulating layer 540 may be patterned to form openings for forming the intermediate pads 530, a seed layer or barrier layer may be conformally formed in each of the openings, and a plating process may be performed using the seed layer or barrier layer as a seed to form the intermediate pads 530 filling the openings.

Alternatively, a seed layer or barrier layer may be formed on the first molding part 410, a sacrificial layer may be formed on the seed layer or barrier layer and then may be patterned to form openings for forming the intermediate pads 530, and a plating process may be performed using the seed layer or barrier layer in the openings as a seed to form the intermediate pads 530 filling the openings. Thereafter, the sacrificial layer may be removed, and the seed layer or barrier layer may be patterned using the intermediate pads 530 as masks. Thus, the seed layer or barrier layer may remain between the first molding part 410 and each of the intermediate pads 530. Thereafter, the intermediate insulating layer 540 surrounding the intermediate pads 530 may be formed on the first molding part 410. In these cases, the semiconductor package described with reference to FIG. 4 may be manufactured. Hereinafter, the embodiments of FIG. 12 will be described continuously as examples.

Figure 14:
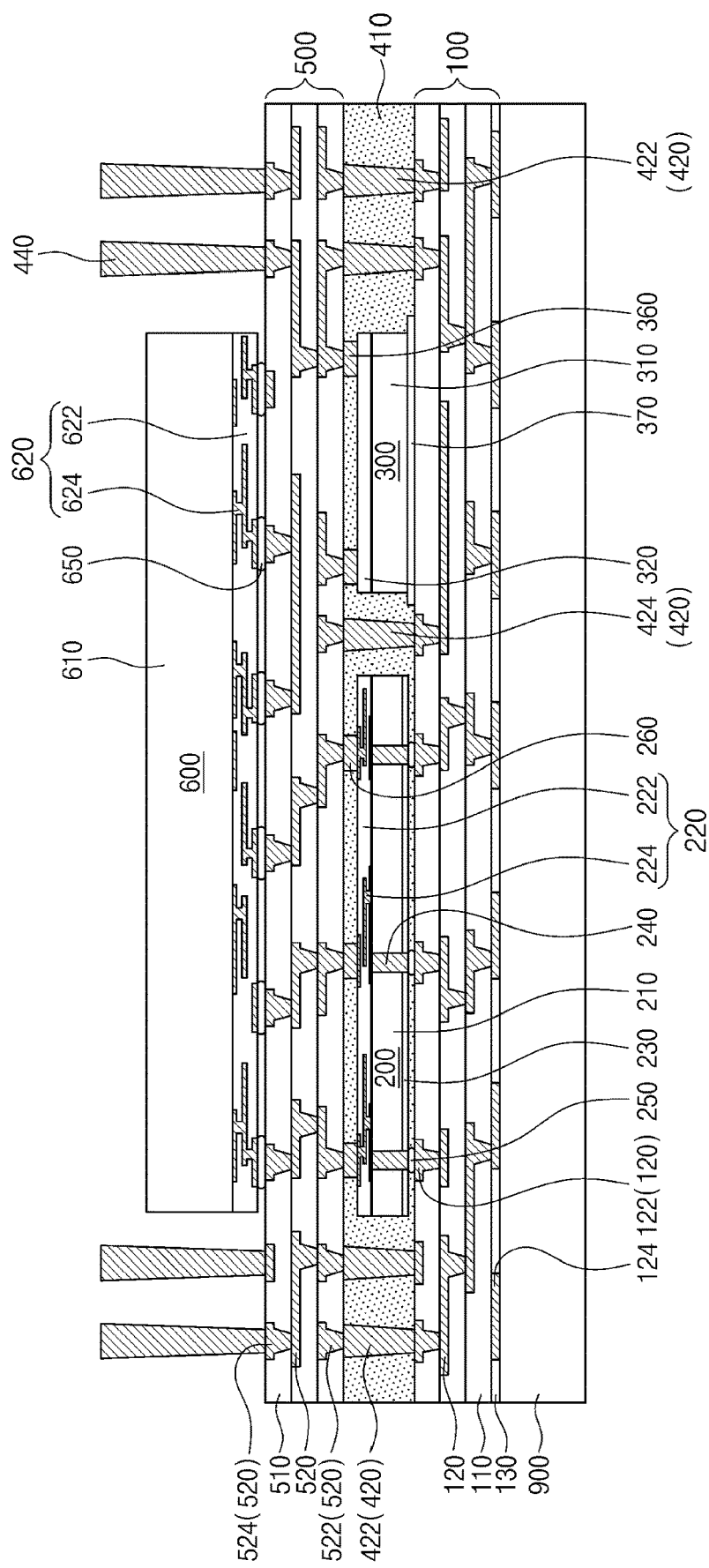

Referring to FIG. 14, second through-electrodes 440 may be formed on the redistribution layer 500. For example, a sacrificial layer may be formed on the redistribution layer 500, via holes penetrating the sacrificial layer to expose second redistribution pads 524 of the redistribution layer 500 may be formed, and then, the second through-electrodes 440 may be formed by filling the via holes with a conductive material. Thereafter, the sacrificial layer may be removed.

A third device 600 may be provided. Components of the third device 600 may be the same as or similar to those described with reference to FIG. 1. For example, the third device 600 may include a third base layer 610 and a third circuit layer 620 provided on an active surface of the third base layer 610.

The third device 600 may be mounted on the redistribution layer 500. For example, second chip terminals 650 may be provided on the third circuit layer 620 of the third device 600. The third device 600 may be aligned in such a way that the second chip terminals 650 are located on the second redistribution pads 524 of the redistribution layer 500, and then, a reflow process may be performed to connect the second chip terminals 650 to the third circuit layer 620 and the redistribution layer 500. For example, the second chip terminals 650 may be electrically connected to the third circuit layer 620 and to the redistribution layer 500 by a reflow soldering process.

Figure 15:
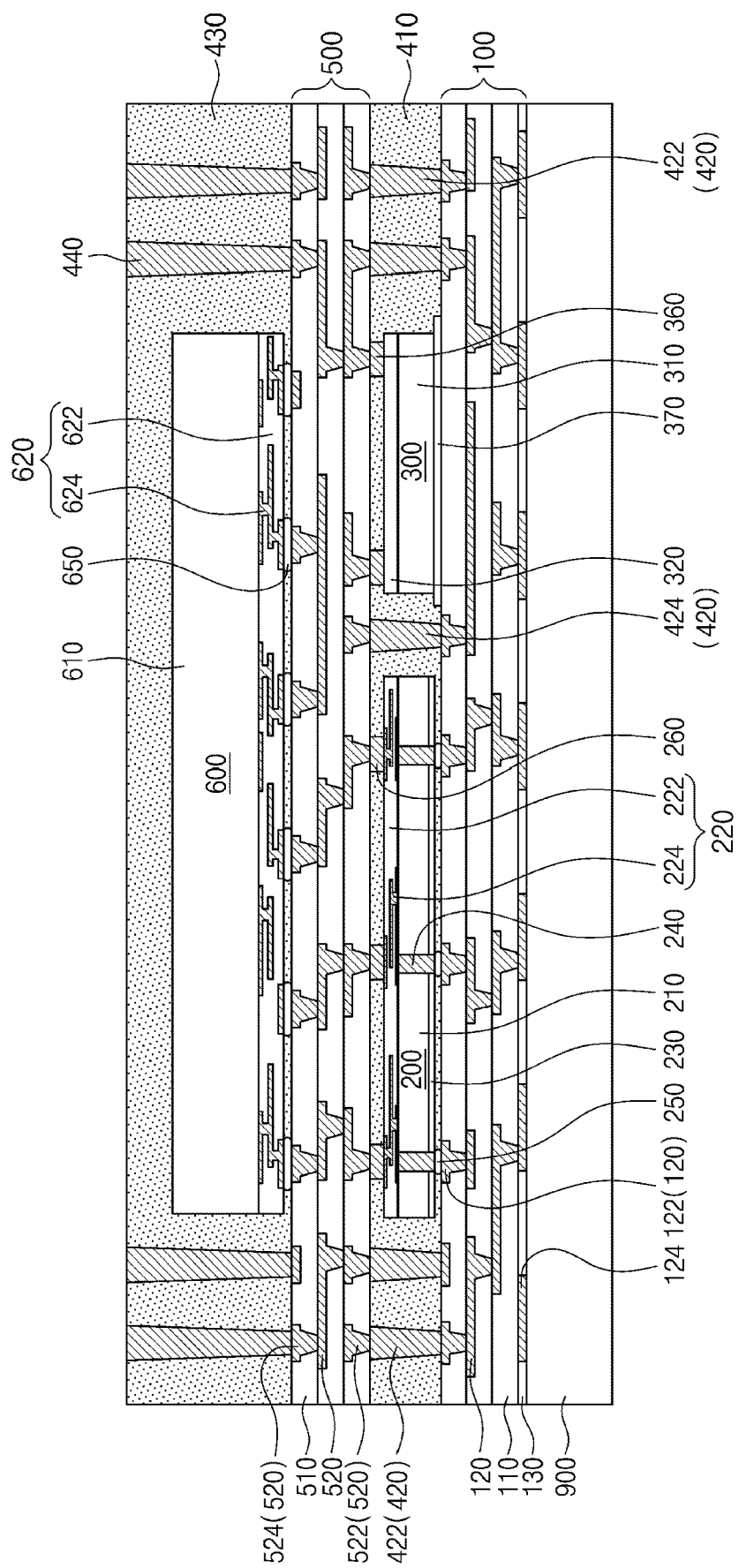

Referring to FIG. 15, a second molding part 430 may be formed on the redistribution layer 500. For example, a molding material may be formed on the top surface of the redistribution layer 500 to cover the third device 600, and the molding material may be hardened to form the second molding part 430. The second molding part 430 may cover and/or contact a top surface and side surfaces of the third device 600 and may surround the second through-electrode 440. For example, the second molding part 430 may contact side surfaces of the second through-electrode 440.

Thereafter, a portion of the second molding part 430 may be removed. For example, the second molding part 430 may be thinned. For example, a grinding process or a chemical mechanical polishing (CMP) process may be performed on a top surface of the second molding part 430. Thus, the top surface of the second molding part 430 may be planarized. An upper portion of the second molding part 430 may be removed by the thinning process. Upper portions of the second through-electrodes 440 may also be removed by the thinning process as necessary. After the thinning process, top surfaces of the second through-electrodes 440 may be exposed. The top surfaces of the second through-electrodes 440 and the top surface of the second molding part 430 may be substantially flat and may be substantially coplanar with each other.

Figure 16:
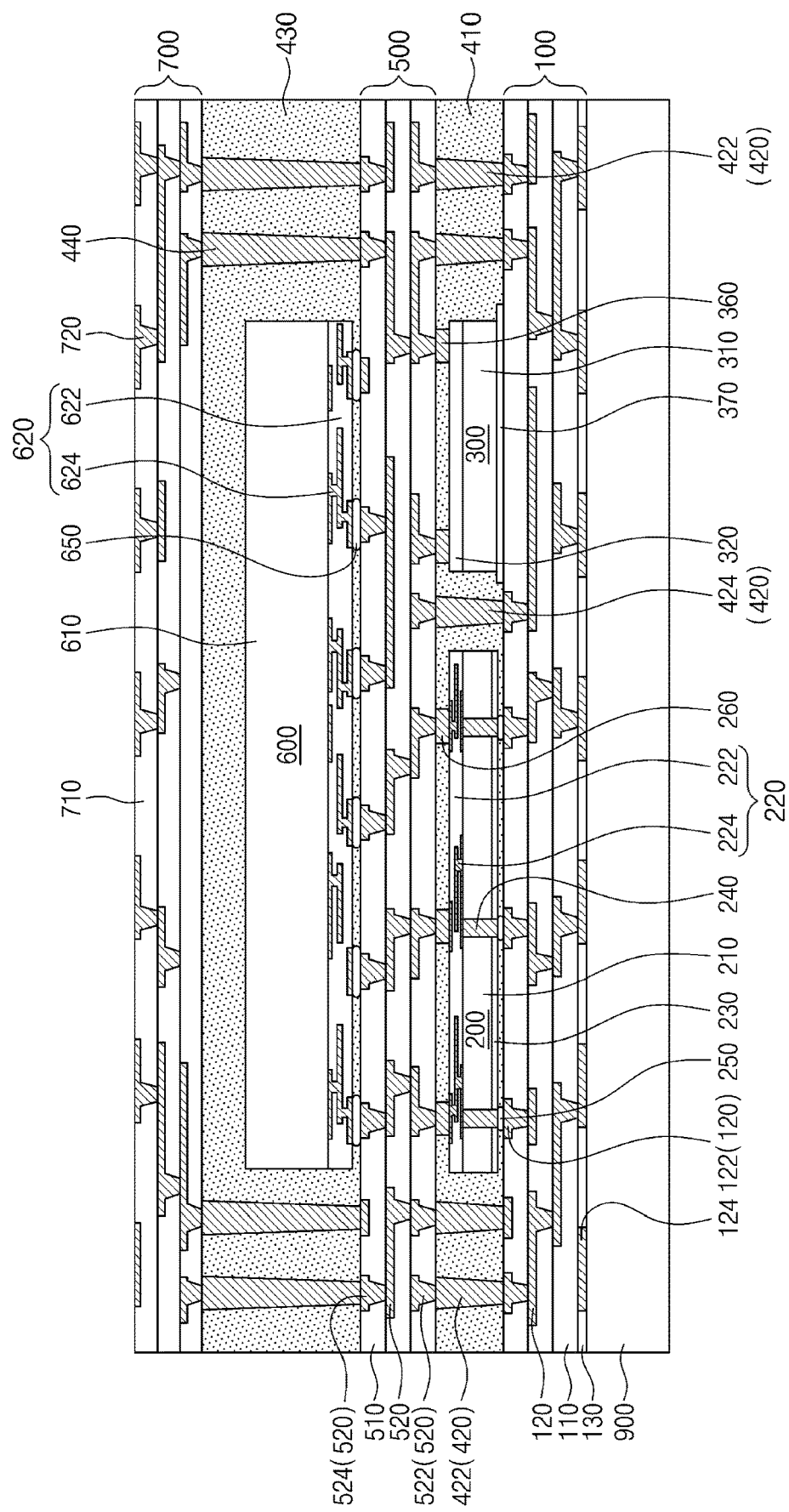

Referring to FIG. 16, a second package substrate 700 may be formed on the second molding part 430. For example, a second substrate insulating layer 710 may be formed on the second molding part 430. The second substrate insulating layer 710 may include or be formed of an insulating polymer or a photoimageable dielectric (PID). Second substrate interconnection patterns 720 may be formed in the second substrate insulating layer 710. For example, the second substrate insulating layer 710 may be patterned to form openings for forming the second substrate interconnection patterns 720, a seed layer may be conformally formed in each of the openings, and a plating process may be performed using the seed layer as a seed to form the second substrate interconnection patterns 720 filling the openings. The openings may expose the second through-electrodes 440. Thus, the second substrate interconnection patterns 720 may be electrically connected to and/or contact the second through-electrodes 440. One substrate interconnection layer may be formed as described above.

Another second substrate insulating layer 710 may be formed on the one substrate interconnection layer. The other second substrate insulating layer 710 may be formed by a coating process such as a spin coating process or a slit coating process. The other second substrate insulating layer 710 may include or be formed of a photoimageable dielectric (PID). Openings exposing the second substrate interconnection patterns 720 of the one substrate interconnection layer provided thereunder may be formed in the other second substrate insulating layer 710, a seed layer may be conformally formed in each of the openings, and a plating process may be performed using the seed layer as a seed to form second substrate interconnection patterns 720 filling the openings. As described above, other substrate interconnection layers may be formed on the one substrate interconnection layer.

However, the inventive concepts are not limited to the above embodiments in which the second package substrate 700 is formed.

Referring again to FIG. 1, the carrier substrate 900 may be removed. Thus, the lower insulating layer 130 and the second substrate pads 124 of the first package substrate 100 may be exposed.

Thereafter, external terminals 140 may be provided on the exposed second substrate pads 124, respectively. The semiconductor package 10 described with reference to FIG. 1 may be manufactured as described above.

Referring to FIG. 6, an upper package 20 may be provided. The upper package 20 may include an upper package substrate 810, an upper semiconductor chip 820, and an upper molding part 830. For example, the upper semiconductor chip 820 may be mounted on the upper package substrate 810, and then, an insulating material may be formed on the upper package substrate 810 to form the upper molding part 830 covering the upper semiconductor chip 820. For example, the upper molding part 830 may contact a top surface and side surfaces of the upper semiconductor chip 820.

The upper package 20 may be mounted on the second package substrate 700. For example, substrate terminals 812 may be provided on a bottom surface of the upper package substrate 810. The upper package 20 may be aligned on the second package substrate 700 in such a way that the substrate terminals 812 face the second package substrate 700, and then, a reflow process may be performed to connect the substrate terminals 812 to the second package substrate 700 and the upper package substrate 810. For example, the substrate terminals 812 may be electrically connected to the second package substrate 700 and to the upper package substrate 810 by a reflow soldering process.

The semiconductor package described with reference to FIG. 6 may be manufactured as described above.

Figure 17:
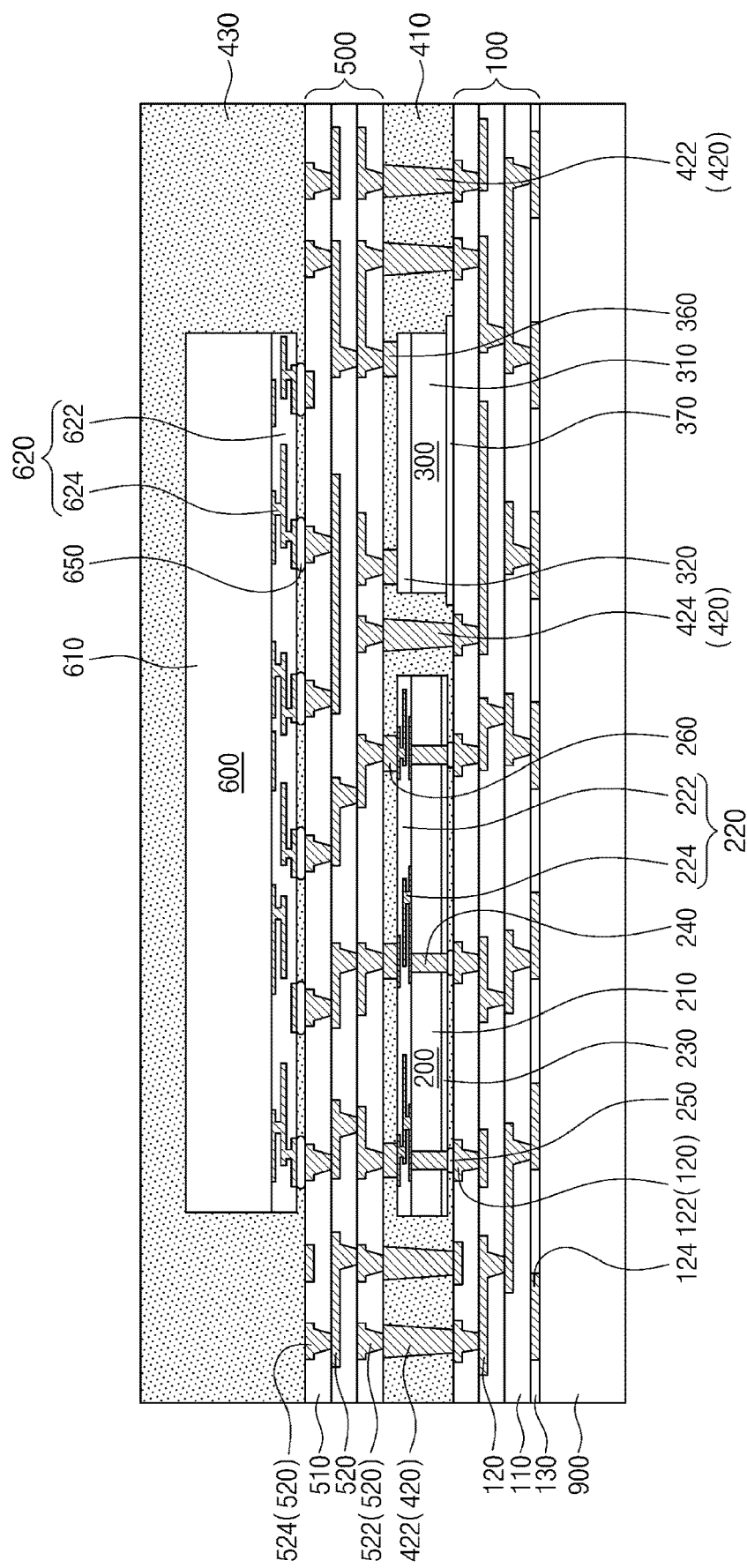
Figure 18:
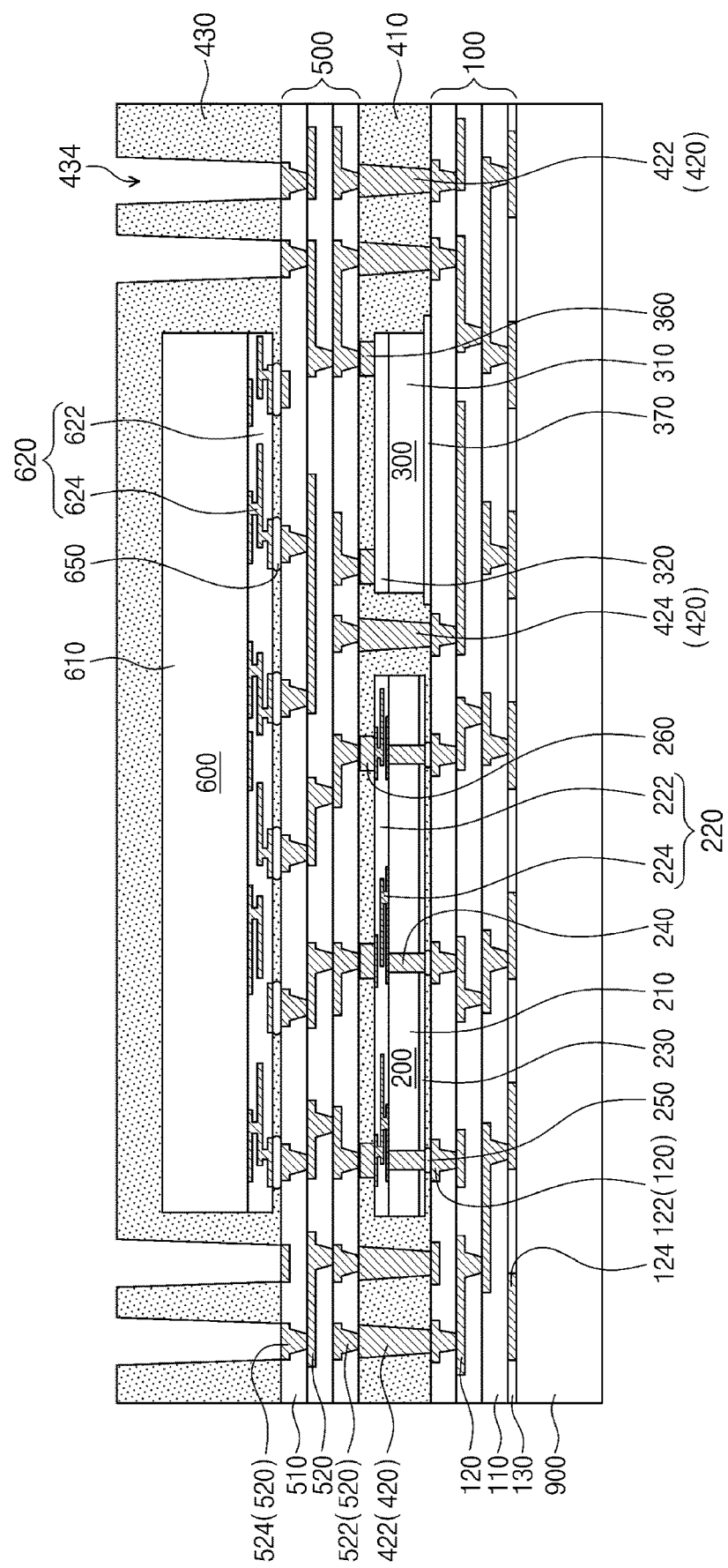

FIGS. 17 and 18 illustrate cross-sectional views showing a method of manufacturing a semiconductor package according to some example embodiments of the present inventive concepts.

Referring to FIG. 17, a third device 600 may be provided on the resultant structure of FIG. 12. Components of the third device 600 may be the same as or similar to those described with reference to FIG. 1. For example, the third device 600 may include or be formed of a third base layer 610 and a third circuit layer 620 provided on an active surface of the third base layer 610.

The third device 600 may be mounted on the redistribution layer 500. For example, second chip terminals 650 may be provided on the third circuit layer 620 of the third device 600. The third device 600 may be aligned in such a way that the second chip terminals 650 are located on the second redistribution pads 524 of the redistribution layer 500, and then, a reflow process may be performed to connect the second chip terminals 650 to the third circuit layer 620 and the redistribution layer 500. For example, the second chip terminals 650 may be electrically connected to the third circuit layer 620 and to the redistribution layer 500 by a reflow soldering process.

Thereafter, a second molding part 430 may be formed on the redistribution layer 500. For example, a molding material may be formed on the top surface of the redistribution layer 500 to cover the third device 600, and the molding material may be hardened to form the second molding part 430. The second molding part 430 may cover and/or contact a top surface and side surfaces of the third device 600.

Referring to FIG. 18, through-holes 434 may be formed in the second molding part 430. The through-holes 434 may expose the redistribution patterns 524 of the redistribution layer 500. For example, a mask pattern may be formed on the second molding part 430, and then, the second molding part 430 may be patterned using the mask pattern as an etch mask to form the through-holes 434.

Referring again to FIG. 15, second through-electrodes 440 may be formed in the through-holes 434 (see FIG. 18) of the second molding part 430. For example, a seed layer may be formed on the second molding part 430 to conformally cover inner surfaces of the through-holes 434, and then, a plating process may be performed using the seed layer as a seed to form the second through-electrodes 440 filling the through-holes 434.

Subsequent processes may be the same as or similar to those described with reference to FIGS. 16, 1 and 6. For example, the second package substrate 700 may be formed on the second molding part 430. The upper package 20 may be mounted on the second package substrate 700 as necessary.

In certain embodiments, the second through-electrode 440 and the second package substrate 700 may not be formed.

Referring again to FIG. 8, the upper package 20 may be provided on the resultant structure of FIG. 18. The upper package 20 may include an upper package substrate 810, an upper semiconductor chip 820, and an upper molding part 830. For example, the upper semiconductor chip 820 may be mounted on the upper package substrate 810, and then, an insulating material may be formed on the upper package substrate 810 to form the upper molding part 830 covering the upper semiconductor chip 820. For example, the upper molding part 830 may contact a top surface and side surfaces of the upper semiconductor chip 820.

The upper package 20 may be mounted on the redistribution layer 500. For example, substrate terminals 814 may be provided on a bottom surface of the upper package substrate 810. The upper package 20 may be disposed on the second molding part 430 in such a way that the substrate terminals 814 face the second molding part 430. At this time, the upper package 20 may be aligned on the second molding part 430 in such a way that positions of the substrate terminals 814 correspond to and/or vertically overlap those of the through-holes 434, respectively. The substrate terminals 814 may be inserted into the through-holes 434 to be in contact with the second redistribution pads 524 of the redistribution layer 500. Thereafter, a reflow process may be performed to connect the substrate terminals 814 to the redistribution layer 500 and the upper package substrate 810. For example, the substrate terminals 814 may be electrically connected to the redistribution layer 500 and to the upper package substrate 810 by a reflow soldering process.

The semiconductor package described with reference to FIG. 8 may be manufactured as described above.

In the semiconductor package according to the embodiments of the inventive concepts, electrical connection distances between the third device and the first and second devices may be reduced or shortened. In addition, an electrical connection distance between the third device and the first package substrate may be reduced or shortened. Thus, the electrical characteristics of the semiconductor package may be improved.

Furthermore, an area required for arrangement of the first to third devices may be reduced, and distances between the third device and the first and second devices may be reduced. Thus, a small semiconductor package may be realized.

What is claimed is:
1. A semiconductor package comprising:
a first substrate;
a first semiconductor chip and a passive device which are laterally spaced apart from each other on the first substrate and are disposed face-up on the first substrate;
a first molding part surrounding the first semiconductor chip and the passive device on the first substrate;
a second semiconductor chip disposed on the first molding part and electrically connected to the first semiconductor chip and the passive device;
a second molding part surrounding the second semiconductor chip on the first molding part;

first through-electrodes vertically penetrating the first molding part, at least some of first through-electrodes electrically connecting the first substrate to the second semiconductor chip;
external terminals provided under the first substrate, wherein the first semiconductor chip comprises:
a base layer;
a circuit layer provided on a top surface of the base layer, the top surface of the base layer facing the second semiconductor chip; and
a via penetrating the base layer to be electrically connected to the circuit layer,
a solder bump connecting the via to the first substrate; and
an adhesive film adhering an inactive surface of the passive device to the first substrate.

2. The semiconductor package of claim 1, wherein the second semiconductor chip vertically overlaps the whole of the first semiconductor chip and the whole of the passive device.

3. The semiconductor package of claim 1, further comprising:
a redistribution layer disposed between the first molding part and the second molding part,
wherein the second semiconductor chip is mounted on a top surface of the redistribution layer by using first connection terminals, and
wherein the first semiconductor chip and the passive device are mounted on a bottom surface of the redistribution layer through chip bumps.

4. The semiconductor package of claim 3, wherein a first sub-through-electrode of the first through-electrodes is provided between the first semiconductor chip and the passive device,
wherein a second sub-through-electrode of the first through-electrodes is provided outside the second semiconductor chip in a plan view, and
wherein the second semiconductor chip is electrically connected to the first substrate through the redistribution layer and the first sub-through-electrode.

5. The semiconductor package of claim 3, further comprising:
a second through-electrode vertically penetrating the second molding part; and
a second substrate provided on the second molding part and electrically connected to the second through-electrode,
wherein a second sub-through-electrode of the first through-electrodes is disposed at a side of the first semiconductor chip or at a side of the passive device, and
wherein the second through-electrode is electrically connected to the first substrate through the redistribution layer and the second sub-through-electrode.

6. The semiconductor package of claim 1, further comprising:
first pads provided on a top surface of the first molding part and electrically connected to the circuit layer of the first semiconductor chip; and
second pads provided on the top surface of the first molding part and electrically connected to the passive device,
wherein the second semiconductor chip is mounted on the first and second pads.

7. The semiconductor package of claim 6, further comprising:
an intermediate insulating layer provided between the first molding part and the second molding part,
wherein the intermediate insulating layer surrounds the first and second pads.

8. The semiconductor package of claim 6, wherein the second semiconductor chip is mounted on the first and second pads by using first connection terminals provided between the first pads and some of chip pads provided on a bottom surface of the second semiconductor chip and between the second pads and others of the chip pads.

9. The semiconductor package of claim 1, wherein the first molding part is in contact with the second molding part,
wherein the first semiconductor chip and the passive device are embedded in the first molding part,
wherein each of the first semiconductor chip and the passive device have bumps exposed at a top surface of the first molding part, and
wherein the second semiconductor chip is electrically connected to the exposed bumps.

10. The semiconductor package of claim 9, wherein the second semiconductor chip has chip pads provided on a bottom surface of the second semiconductor chip, and the chip pads contact the bumps.

11. The semiconductor package of claim 1, wherein the first semiconductor chip is electrically connected to the first substrate by using a second connection terminal, the second connection terminal is provided on a bottom surface of the first semiconductor chip to be directly connected to the via.

12. A semiconductor package comprising:
a first substrate;
a first device and a second device spaced apart from each other on the first substrate;
a third device disposed on the first device and the second device, wherein a first active surface of the first device and a second active surface of the second device face a third active surface of the third device;
a first molding part surrounding the first device and the second device on the first substrate;
a second molding part surrounding the third device on the first molding part;
first through-electrodes vertically penetrating the first molding part between the first device and the second device to electrically connect the first substrate to the third device;
second through-electrodes vertically penetrating the first molding part; and
third through-electrodes vertically penetrating the second molding part to be electrically connected to the second through-electrodes,
wherein the third device vertically overlaps the whole of the first device and the whole of the second device,
wherein the first device is connected to the first substrate through solder bumps at a bottom surface of the first device, and
wherein the second device is connected to the first substrate through an adhesive film on a bottom surface of the second device.

13. The semiconductor package of claim 12, further comprising:
a redistribution layer disposed between the first molding part and the second molding part,
wherein the third device is mounted on a top surface of the redistribution layer by using connection terminals, and
wherein each of the first device and the second device have bumps exposed at a top surface of the first molding part, and the first device and the second device are mounted on a bottom surface of the redistribution layer by using the bumps.

14. The semiconductor package of claim 12, further comprising:
an intermediate layer provided between the first molding part and the second molding part; and
pads provided in the intermediate layer,
wherein the first device and the second device are electrically connected to the pads on a bottom surface of the intermediate layer, and the third device is electrically connected to the pads on a top surface of the intermediate layer.

15. The semiconductor package of claim 12, wherein a width of the first device and a width of the second device are less than a width of the third device.

16. The semiconductor package of claim 12, wherein the first device comprises:
a base layer;
a circuit layer provided on the base layer and provided at the first active surface of the first device;
bumps provided on the circuit layer and electrically connected to the circuit layer; and
vias vertically penetrating the base layer to be electrically connected to the circuit layer,
wherein the bumps are exposed at a top surface of the first molding part.

17. A semiconductor package comprising:
a lower package; and
an upper package mounted on the lower package,
wherein the lower package comprises:
a first substrate;
a first semiconductor chip on the first substrate, the first semiconductor chip having first chip pads facing the first substrate;
a second semiconductor chip and a passive device which are provided on the first substrate, are provided on a bottom surface of the first semiconductor chip and are electrically connected to the first chip pads;
a first molding part surrounding the second semiconductor chip and the passive device on the first substrate;
a first through-electrode vertically penetrating the first molding part to electrically connect the first semiconductor chip to the first substrate;
a second through-electrode vertically penetrating the first molding part at a side of the second semiconductor chip to be electrically connected to the first substrate, wherein the second semiconductor chip is connected to the first substrate through solder bumps at a bottom surface of the second semiconductor chip; and
a second molding part surrounding the first semiconductor chip on the first molding part,
wherein the upper package comprises:
an upper package substrate;
an upper semiconductor chip mounted on the upper package substrate;
an upper molding part covering the upper semiconductor chip on the upper package substrate; and
a package connection terminal provided under the upper package substrate and electrically connecting the upper package to the lower package.

18. The semiconductor package of claim 17, wherein the package connection terminal extends into a recess in the first molding part to electrically connect to the second through-electrode.

19. The semiconductor package of claim 17, further comprising:
a third through-electrode vertically penetrating the second molding part to be electrically connected to the second through-electrode,
wherein the package connection terminal electrically connects the third through-electrode to the upper package substrate.

20. The semiconductor package of claim 17, further comprising:
a redistribution layer disposed between the first molding part and the second molding part,
wherein the first semiconductor chip is mounted on a top surface of the redistribution layer by using connection terminals, and
wherein the second semiconductor chip and the passive device have bumps exposed at a top surface of the first molding part, and the second semiconductor chip and the passive device are mounted on a bottom surface of the redistribution layer by using the bumps.

* * * * *